United States Patent
Flack

(10) Patent No.: US 10,333,318 B2
(45) Date of Patent: *Jun. 25, 2019

(54) ELECTRIC VEHICLE SUPPLY EQUIPMENT WITH TEMPERATURE CONTROLLED CURRENT

(71) Applicant: Webasto Charging Systems, Inc., Simi Valley, CA (US)

(72) Inventor: Albert Joseph Flack, Garden Grove, CA (US)

(73) Assignee: Webasto Charging Systems, Inc., Monrovia, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/967,584

(22) Filed: Apr. 30, 2018

(65) Prior Publication Data

US 2018/0244166 A1 Aug. 30, 2018

Related U.S. Application Data

(63) Continuation of application No. 15/356,313, filed on Nov. 18, 2016, now Pat. No. 9,981,563, which is a
(Continued)

(51) Int. Cl.
*H02J 7/00* (2006.01)
*B60L 53/60* (2019.01)
(Continued)

(52) U.S. Cl.
CPC .............. *H02J 7/0021* (2013.01); *B60L 3/04* (2013.01); *B60L 11/1818* (2013.01);
(Continued)

(58) Field of Classification Search
CPC .................................................. B60L 11/1816
See application file for complete search history.

(56) References Cited

U.S. PATENT DOCUMENTS 4,061,956 A 12/1977 Brown et al.
5,847,541 A 12/1998 Hahn
(Continued)

FOREIGN PATENT DOCUMENTS

| WO | 2009/091745 A2 | 7/2009 |
| WO | 2011/127446 A2 | 10/2011 |
| WO | 2012/129104 A1 | 9/2012 |

OTHER PUBLICATIONS

NEMA, NEMA Enclosure Types, National Electrical Manufacturers Association, Nov. 2005, <URL:http://www.nema.org/prod/be/enclosures/upload/NEMA_Enclosure_Types.pdf>, 9 pgs.
(Continued)

*Primary Examiner* — Daniel J Cavallari
(74) *Attorney, Agent, or Firm* — Christopher R. Balzan, Esq.; Eric J. Aagaard, Esq.

(57) ABSTRACT

In electric vehicle supply equipment (EVSE), interruption of charging due to overheating is prevented by adjusting the pulse duty cycle on the control pilot conductor communicating the maximum allowed current level to the electric vehicle, the adjustment being performed whenever the EVSE temperature exceeds a predetermined threshold temperature below the maximum operating temperature as a function of the approach of the temperature to the maximum operating temperature.

9 Claims, 22 Drawing Sheets

Related U.S. Application Data continuation of application No. 14/875,909, filed on Oct. 6, 2015, now Pat. No. 9,533,599, which is a continuation of application No. 13/639,910, filed as application No. PCT/US2011/031843 on Apr. 8, 2011, now Pat. No. 9,156,362.

(60) Provisional application No. 61/322,807, filed on Apr. 9, 2010, provisional application No. 61/434,282, filed on Jan. 19, 2011, provisional application No. 61/437,001, filed on Jan. 27, 2011, provisional application No. 61/467,068, filed on Mar. 24, 2011.

(51) Int. Cl.
  *B60L 3/04* (2006.01)
  *B60L 11/18* (2006.01)
  *H05K 7/00* (2006.01)

(52) U.S. Cl.
  CPC .............. *B60L 53/60* (2019.02); *H02J 7/007* (2013.01); *H02J 7/0026* (2013.01); *H02J 7/0042* (2013.01); *H02J 7/0045* (2013.01); *H02J 7/0047* (2013.01); *H05K 7/00* (2013.01); *B60L 2230/12* (2013.01); *B60L 2230/16* (2013.01); *B60L 2240/36* (2013.01); *B60L 2250/10* (2013.01); *Y02T 10/7005* (2013.01); *Y02T 10/7088* (2013.01); *Y02T 90/121* (2013.01); *Y02T 90/128* (2013.01); *Y02T 90/14* (2013.01); *Y02T 90/16* (2013.01); *Y02T 90/163* (2013.01)

(56) References Cited

U.S. PATENT DOCUMENTS

| | | |
|---|---|---|
| 6,198,251 B1 | 3/2001 | Landon |
| 6,577,100 B1 | 6/2003 | Hansson et al. |
| 7,583,053 B2 | 9/2009 | Kamohara |
| 8,299,754 B2 | 10/2012 | Hayashigawa et al. |
| 8,649,923 B2 | 2/2014 | Sankaran |
| 8,710,796 B2 | 4/2014 | Muller et al. |
| 8,860,366 B2 | 10/2014 | Muller et al. |
| 9,156,362 B2 | 10/2015 | Soden et al. |
| 9,308,825 B2 | 4/2016 | Hayashigawa et al. |
| 9,365,123 B2 | 6/2016 | Flack |
| 9,365,124 B2 | 6/2016 | Soden et al. |
| 9,421,875 B1 | 8/2016 | Flack |
| 9,533,599 B2 | 1/2017 | Soden et al. |
| 9,981,563 B2 | 5/2018 | Flack |
| 2003/0101459 A1 | 5/2003 | Edson |
| 2004/0075418 A1 | 4/2004 | Denham et al. |
| 2008/0185991 A1 | 8/2008 | Harris et al. |
| 2008/0196946 A1 | 8/2008 | Filippov et al. |
| 2009/0015209 A1 | 1/2009 | Morina et al. |
| 2009/0030712 A1 | 1/2009 | Bogolea et al. |
| 2009/0267560 A1 | 10/2009 | Toya et al. |
| 2010/0045232 A1 | 2/2010 | Chen et al. |
| 2010/0079105 A1 | 4/2010 | Iwanaga et al. |
| 2010/0207771 A1 | 8/2010 | Trigiani |
| 2010/0259227 A1* | 10/2010 | Gale ............... H02J 7/022 320/162 |
| 2011/0006731 A1 | 1/2011 | Wang et al. |
| 2011/0029144 A1 | 2/2011 | Muller et al. |
| 2011/0029146 A1 | 2/2011 | Muller et al. |
| 2011/0172839 A1 | 7/2011 | Brown et al. |
| 2011/0175569 A1 | 7/2011 | Austin |
| 2011/0202418 A1 | 8/2011 | Kempton et al. |
| 2011/0216451 A1 | 8/2011 | Haines et al. |
| 2012/0022811 A1 | 1/2012 | Dickson et al. |
| 2014/0203777 A1 | 7/2014 | Flack |
| 2015/0028812 A1 | 1/2015 | Muller et al. |
| 2015/0367742 A1 | 12/2015 | Soden et al. |
| 2016/0031335 A1 | 2/2016 | Soden et al. |

OTHER PUBLICATIONS

ECS-16 In-Cord EVSE, Product Brochure [online], ClipperCreek, Inc., 2009, retrieved from the Internet: <URL: http://www.clippercreek.com/documents/PDF/operation_manuals/ClipperCreek_ECS-15_Brochure.pdf>, 2 pgs.

* cited by examiner

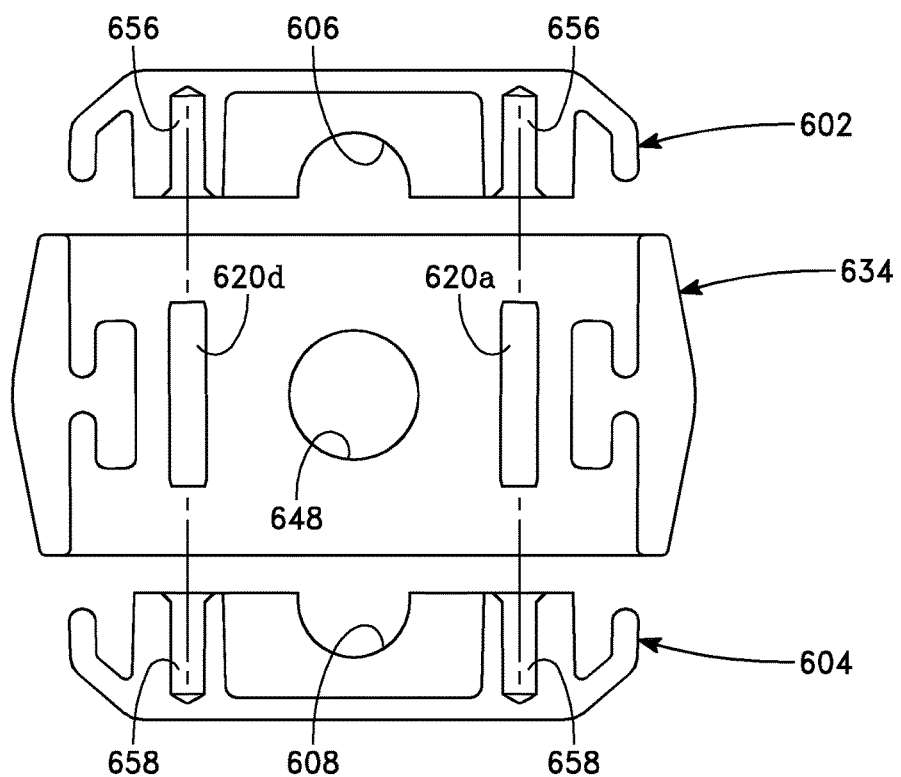
FIG. 17
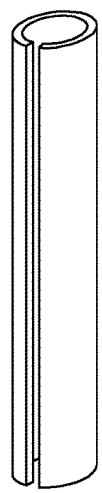  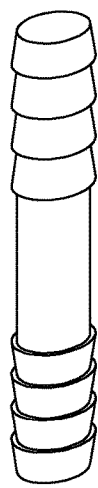  
FIG. 18A   FIG. 18B   FIG. 18C

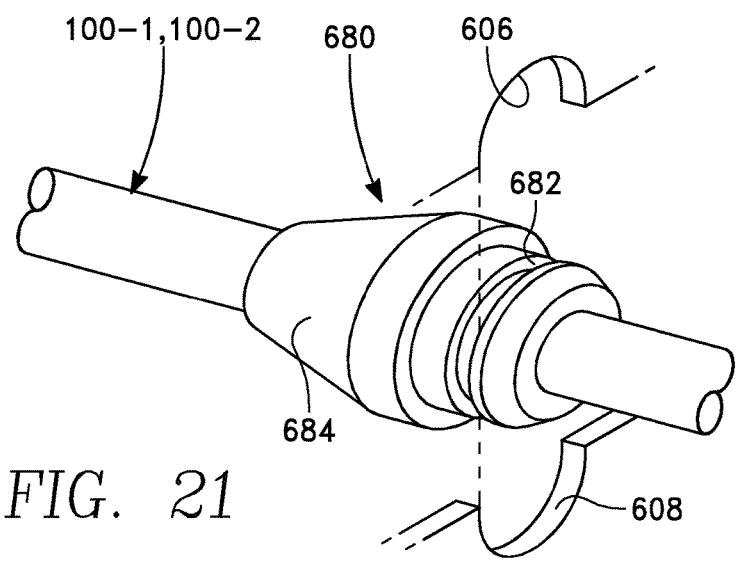
FIG. 21
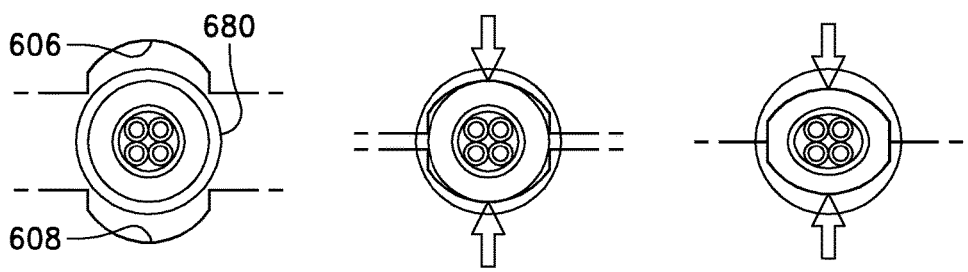
FIG. 22A  FIG. 22B  FIG. 22C
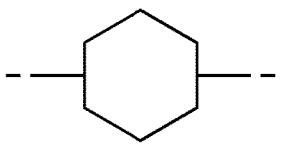 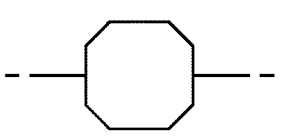 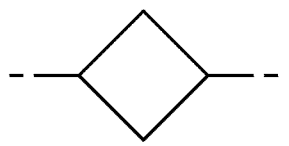
FIG. 23A  FIG. 23B  FIG. 23C

ELECTRIC VEHICLE SUPPLY EQUIPMENT WITH TEMPERATURE CONTROLLED CURRENT

CROSS-REFERENCE TO RELATED APPLICATIONS

This application is a continuation of U.S. patent application Ser. No. 15/356,313, filed Nov. 18, 2016 entitled PORTABLE CHARGING CABLE WITH IN-LINE CONTROLLER, by David Paul Soden, et al., which is a continuation of U.S. patent application Ser. No. 14/875,909, filed Oct. 6, 2015 now U.S. Pat. No. 9,533,599, entitled PORTABLE CHARGING CABLE WITH IN-LINE CONTROLLER, by David Paul Soden, et al., which is a continuation of U.S. patent application Ser. No. 13/639,910, filed Apr. 4, 2013, now U.S. Pat. No. 9,156,362, entitled PORTABLE CHARGING CABLE WITH IN-LINE CONTROLLER, by David Paul Soden, et al., which is the National Stage of International Application No. PCT/US11/31843, filed Apr. 8, 2011 entitled PORTABLE CHARGING CABLE WITH IN-LINE CONTROLLER, by David Paul Soden, et al., which claims the benefit under 35 USC § 119(e) of U.S. Provisional Application No. 61/322,807, filed Apr. 9, 2010 entitled L1/L2 CORD SET & POWER DANGLE, by Albert Joseph Flack, et al., and claims the benefit of U.S. Provisional Application No. 61/434,282, filed Jan. 19, 2011 entitled LEVEL 1-2 PORTABLE EV CHARGER CABLE, by David Paul Soden, et al., and claims the benefit of U.S. Provisional Application No. 61/437,001, filed Jan. 27, 2011 entitled PORTABLE ELECTRIC VEHICLE CHARGING CABLE WITH IN-LINE CONTROLLER, by David Paul Soden, et al., and claims the benefit of U.S. Provisional Application No. 61/467,068, filed Mar. 24, 2011 entitled PORTABLE CHARGING CABLE WITH IN-LINE CONTROLLER, by David Paul Soden, et al. All of the above applications are hereby incorporated by reference in their entirety.

TECHNICAL FIELD

The invention concerns electric supply equipment such as home-charging devices for electric vehicles.

BACKGROUND

Electric vehicle supply equipment (EVSE) for residential charging of an electric vehicle (EV) is implemented at present as stationary units connected to the electric utility grid through a household electric utility panel, and are not readily portable. The possibility of a loss of battery power when the EV is far from a commercial recharging station or personal home charging equipment is a problem that has not been solved.

SUMMARY

A portable electric vehicle support equipment (EVSE) unit is formed as a cord of plural insulated conductors and a flexible outer sheath enclosing said plural insulated conductors. The cord includes an EVSE docking connector on a docking end of the cord and a utility plug on a utility end of the cord, said cord being divided into a docking section terminated at said docking connector and a utility section terminated at said utility connector. The cord further includes an in-line EVSE controller and a housing enclosing said controller, said housing sealed with said flexible outer sheath and disposed at an intermediate section of said cord between said docking and utility sections. The in-line EVSE controller is connected in series between conductors of said docking section and conductors of said utility section. In one embodiment, the sheath and said housing form a continuous outer seal. The housing is sealed with a portion of said sheath enclosing said docking section or it is sealed with portions of said sheath enclosing both said docking and utility sections.

In embodiments, the housing is joined with said utility and docking sections at opposing ends of the housing, said housing being suspended between said docking and utility sections of said cord so as to be freely movable with the cord. In one embodiment, the housing has as length of about 5-6 inches, a width of about 3-4 inches and a height of about 0.5-2 inches and has a mass less than the mass of said docking section of said cord.

In embodiments, said housing includes a pair of congruent upper and lower half shells having respective outer side walls, each of said half shells having a pair of half openings at opposite ends of the respective half shell, annular portions of said docking and utility sections being compressed between edges of facing ones of said half openings. The in-line controller may include a circuit board having electrical components connected to conductors of said docking and utility sections of said cord, and a potting compound encapsulating said circuit board between said half shells.

In embodiments, the housing further includes a bumper formed of an elastically deformable material and surrounding the outer side walls of said half shells. The bumper has holes in registration with said half openings. The bumper may be integrally formed and may include an annular outer case and an annular interior belt surrounded by said outer case, said annular interior belt comprising an upward facing lip and a downward facing lip, an upper bumper groove being defined between said outer case and said upper facing lip and a lower bumper groove being defined between said outer case and said downward facing lip. The upper and lower half shells may comprise respective interior walls parallel with the respective ones of said outer side walls and forming respective upper and lower shell grooves. The upward facing lip is compressed in said upper shell groove, and said downward facing lip is compressed in said lower shell groove. The edge portions of the respective outer side walls are pressed inside respective ones of said upper and lower bumper grooves.

In embodiments, the outer case comprises a pair of opposing arcuate end skirts and a pair of straight gripping saddles joining said end skirts, each of said end skirts having a first height extending above a ceiling of said upper half shell and below a floor of said lower half shell, said gripping saddles having a second height less than said first height, to provide free air flow around the housing as its rests on a surface. The outer case of said bumper forms a bumper side wall, said bumper side wall comprising an annular convex apex that promotes rotation of the housing whenever it is placed on one of its side edges.

In embodiments, there is a control pilot conductor in said docking section of said cord, and said in-line EVSE controller comprises a microprocessor comprising a serial port, an analog buffer coupled between said microprocessor and said control pilot conductor, and a conductor connected between said serial port and said control pilot conductor. In further embodiments, the in-line controller further includes a pulse generator coupled to said control pilot conductor and having a duty cycle controlled by said microprocessor, signifying a maximum current limit, and a temperature sensor having a temperature output coupled to said microprocessor, said temperature output representing a present temperature. In embodiments, said microprocessor is programmed to reduce charging current flow through said EVSE cord whenever said present temperature exceeds a predetermined limit, by adjusting said duty cycle in response to said present temperature approaching a predetermined temperature limit.

In further embodiments, a method is provided for communicating digital data between said in-line controller of the EVSE cord and an external digital device, said method comprising coupling a serial port of a microprocessor of said in-line controller to a conductor of said cord that runs between said in-line controller and said docking connector, and coupling a serial port of an external digital device to said conductor by connection to said docking connector. The external digital device may be any one of a personal computer, a notebook computer, a cell phone, a personal digital assistant, or an interface tool dedicated to external connection with said docking conductor.

In embodiments, the method may further include downloading from said microprocessor to said digital device via said serial port an identification of firmware stored in said in-line controller, determining whether said firmware has been superseded, and uploading from said digital device to said microprocessor via said serial port and via said conductor a current version of said firmware.

In related embodiments, the method may include downloading from said microprocessor to said digital device status data representative of conditions in or status of said EVSE cord, interpreting said status data and generating an image representing a meaning of said status data on a display of said digital device. The data may be downloaded on a request-only basis or as a constant stream.

In an alternative embodiment, the EVSE cord is connected to the EV, and the method includes downloading from said microprocessor via said serial port to the EV digital device status data representative of conditions in or status of said EVSE cord, interpreting said status data and generating an image representing a meaning of said status data on a display of said EV.

In another embodiment, the utility connector may be adapted to connect to different outlets of different voltages (e.g., 120 VAC and 240 VAC), and the method further includes sensing at a sensor in said in-line controller a utility voltage received through said utility connector, determining in said processor which one of plural predetermined voltage ranges said utility voltage is closest to, and setting said one predetermined voltage range as the allowed voltage range. The processor may issue a fault alarm whenever an output of said sensor indicates said utility voltage is outside of said one predetermined range. In a related embodiment, the system designer may have previously correlated the different possible utility voltages to different maximum allowable current levels. The method controls the pulse duty cycle imposed on the control pilot conductor to signify a maximum current level, and sets said duty cycle to a current level previously correlated to said one predetermined voltage range.

In another embodiment, an EVSE kit is provided consisting of the EVSE cord and an interface tool providing external access to the serial port through the control pilot conductor. The interface tool includes (1) a tool enclosure, (2) an EV connector mounted on said tool enclosure for connection with said control pilot conductor, and (3) a serial port connector mounted on said tool enclosure and adapted to receive a serial port connector from an external digital device. The EVSE docking connector can be connected to the charging port of an EV whenever the EV is to be charged and can be connected to said interface tool whenever digital communication with said in-line controller is to be performed.

In an alternative embodiment, the interface tool may be a stand-alone handheld device that includes a processor in said tool enclosure, a display disposed on said tool enclosure, said display controlled by said processor, said processor comprising a serial port coupled to the control pilot conductor whenever the EVSE cord and the interface tool are connected to one another. The interface tool may also include a key pad on said interface tool enclosure. Alternatively, or in addition, the display of said interface tool is a touch screen for user communication with said processor.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

FIG. 17 is a cut-away end view of an exploded assembly corresponding to FIG. 10.

FIGS. 18A, 18B and 18C are orthographic views of different fasteners employed in the embodiment of FIG. 17.

FIG. 21 is an orthographic view corresponding to a portion of FIG. 10 and depicting a third embodiment of cable strain relief.

FIGS. 22A, 22B and 22C are cut-away end views corresponding to FIG. 21 depicting sequential compression of a cable fitting.

FIGS. 23A, 23B and 23C depict alternative shapes of cable openings providing strain relief, including a hexagonal opening (FIG. 23A), an octagonal opening (FIG. 23B) and a square or diamond-shaped opening (FIG. 23C).

Figure 1:
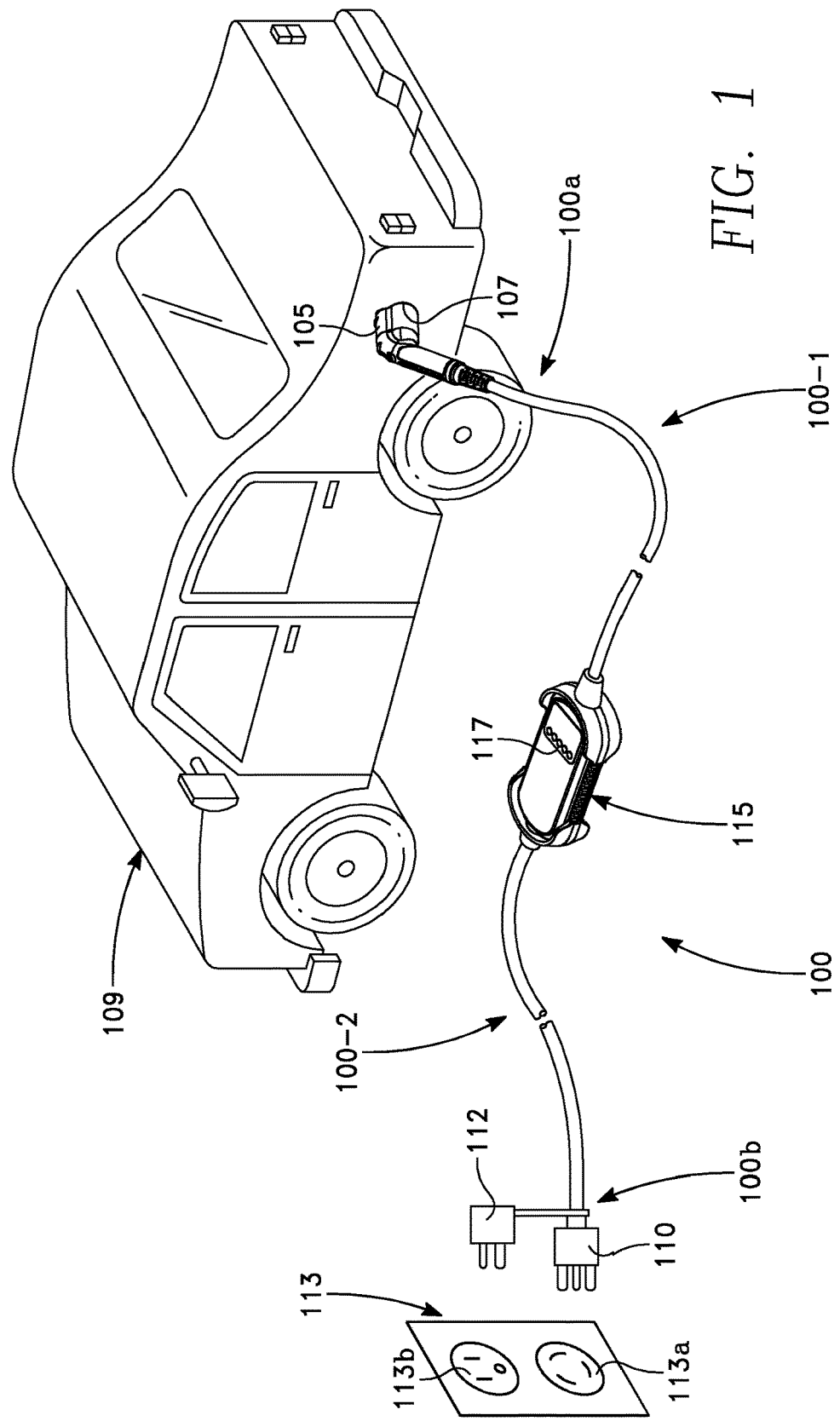
FIG. 1 depicts the portable charging cable of one embodiment.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention facilitate charging an EV using commonly available electricity outlets with a cable that functions as a light transportable EVSE unit. The light transportable EVSE unit can be easily carried in an EV and independently used at remote locations to charge the EV from standard electric power outlets. Electrical and electronic components required to perform the functions of an EVSE are integrated into the cable that constitutes the light transportable EVSE unit, in one embodiment.

Referring to FIG. 1, the light transportable EVSE unit, in one embodiment, is an intelligent portable charging cable 100. The exterior surface of the cable 100 is formed by a cylindrical flexible sleeve of an insulating material such as rubber or flexible plastic, for example. The cable 100 contains multiple insulated conductors described below with reference to FIG. 2. In FIG. 1, a docking end 100a of the portable charging cable 100 has a docking connector 105 connectable to an EV charging port 107 of an EV 109. A utility end 100b of the portable charging cable 100 has a 240 Volt AC plug 110 connectable to a standard 240 Volt AC power outlet 113a. Optionally, a 120 Volt-to-240 Volt plug adapter 112 connectable to a standard 120 Volt AC power outlet 113b may be tethered to the utility end 100b of the cable 100. The portable charging cable 100 further includes a programmable in-line controller 115 situated at an intermediate location between the docking end 100a and the utility end 100b and interrupting the conductor paths within the portable charging cable 100. The in-line controller 115 thus divides the portable charging cable 100 into a docking cable section 100-1 and a utility cable section 100-2. The in-line controller 115 provides the portable charging cable 100 with the complete functionality of a conventional EVSE unit, including the capability to perform charging of an EV and to perform the communication protocols required by the EV on-board systems. For this purpose, the in-line controller 115 includes circuit elements and programmable controller elements adapted to implement the required functionality, as will now be described.

Figure 2:
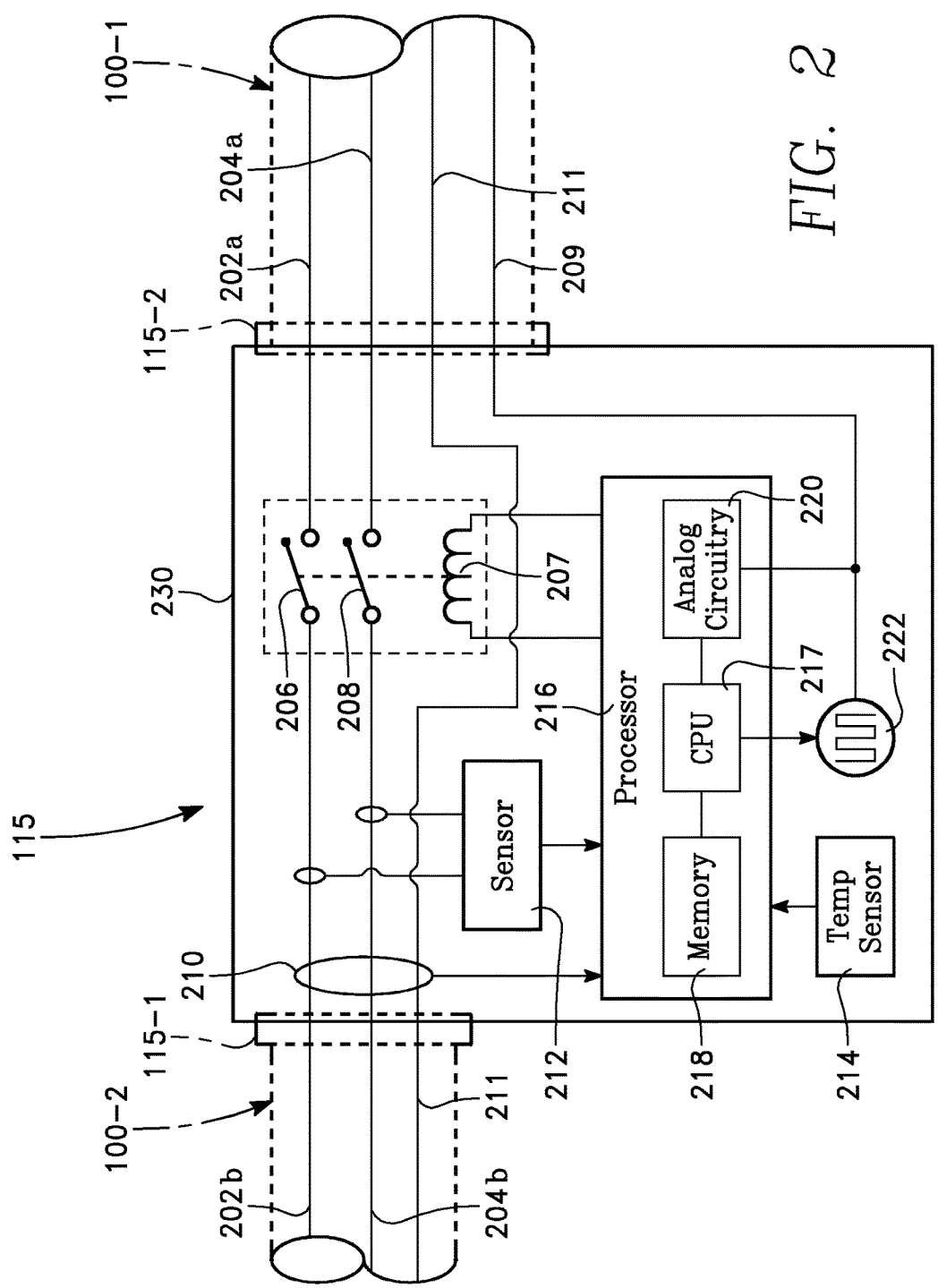
FIG. 2 is a simplified block diagram depicting internal elements of the portable cable of FIG. 1.

Referring to FIGS. 1 and 2, the cable docking section 100-1 contains a pair of insulated power conductors 202a, 204a extending from the docking connector 105 to and into one side of the in-line controller 115. The cable utility section 100-2 contains a pair of insulated power conductors 202b, 204b extending from the plug 110 to and into an opposite side of the in-line controller 115. Within the in-line controller 115, a pair of contactors 206, 208 provide interruptible connection between the power conductors 202a, 202b and between the power conductors 204a, 204b, respectively. The contactors 206, 208 are actuated by an actuator 207 which may be a solenoid or other suitable device, and will be referred to herein as a solenoid.

Communication between in-line controller 115 and the EV 109 is carried over a control pilot conductor 209 of the docking section 100-1 of the cable 100. Such communication may be implemented in accordance with the communication protocols defined in Section 5.3 of the Society of Automotive Engineers Specification SAE J1772. A neutral grounded conductor 211 extends through the entire length of the portable charging cable 100. The neutral grounded conductor 211 may correspond to utility ground at the connector 110. Each of the conductors 202a, 204a, 209 and 211 is connected to a corresponding conductive pin (not shown) inside the docking connector 105.

The in-line controller 115 may include various sensors, such as a ground-fault coil sensor 210, a sensor 212 connected to the power conductors 202b, 204b and adapted to sense voltage (and/or phase and/or frequency) of the power from the power outlet 113, and a temperature sensor 214 to monitor temperature inside the in-line controller 115. Operation of the in-line controller 115 is governed by a computer or processor 216. Each of the sensors 210, 212 and 214 has an output connected to an input of the processor 216. The processor 216 has a central processing unit (CPU) or microprocessor 217 and a memory 218 storing a set of program instructions in the form of firmware. The microprocessor 217 executes the program instructions to perform various functions including implementing the required communication protocols with the on-board systems of the EV. If the communication protocols are those defined in Society of Automotive Engineers Specification SAE J1772, they are implemented by the EVSE and the EV imposing a sequence of voltage changes on the control pilot conductor 209. For this purpose, analog circuitry 220 is coupled between the microprocessor 217 and the control pilot conductor 209 that enables the microprocessor 217 to impose the required voltage changes on the control pilot conductor 209 (and to sense voltage changes imposed on the control pilot conductor 209 by the internal systems of the EV 109). Pulse modulation of the voltage on the control pilot conductor 209 is performed by a pulse generator 222 whose pulse duty cycle is controlled by the microprocessor 217. The pulse duty cycle signifies to the EV the maximum allowable charging current that may be drawn from the EVSE.

If the microprocessor 217 determines from the sensor 212 that the utility cord section 100-2 is connected to a voltage of 120 volts, then the microprocessor 217 sets the pulse duty cycle to a value signifying a particular current level (e.g., a Level 1 current level defined by SAE J1772). If the microprocessor 217 determines that the utility cord section 100-2 is connected to a voltage of 240 volts, then the microprocessor 217 may set the pulse duty cycle to a value signifying another current level (e.g., a Level 2 current defined by SAE J1772). Such current levels may be predetermined in accordance with the current ratings of the components of the portable charging cable 100, particularly the current ratings of the 220 Volt plug 110 and the 120 Volt adapter 112 of FIG. 1.

The D.C. voltage on the control pilot conductor 209 is controlled and sensed through the analog circuitry 220 by the microprocessor 217 in accordance with the required communication protocol. The microprocessor 217 controls the solenoid 207 to open or close the contactors 206, 208. The microprocessor 217 monitors the outputs of the ground fault interrupt sensor 210, the voltage/frequency/phase sensor 212 and the temperature sensor 214 to determine whether any conditions arise that are outside of a prescribed set of conditions (e.g., voltage beyond a prescribed range, temperature outside of a prescribed range, ground fault occurrence, etc.), and if so, opens the contactors 206 and 208. Such an occurrence may be indicated under control of the microprocessor 217 on a user interface or by external lights or light emitting diodes (LEDs) 117 provided on the in-line controller 115 as shown in FIG. 1. The light patterns for different conditions may be specified for the user.

Figure 3:
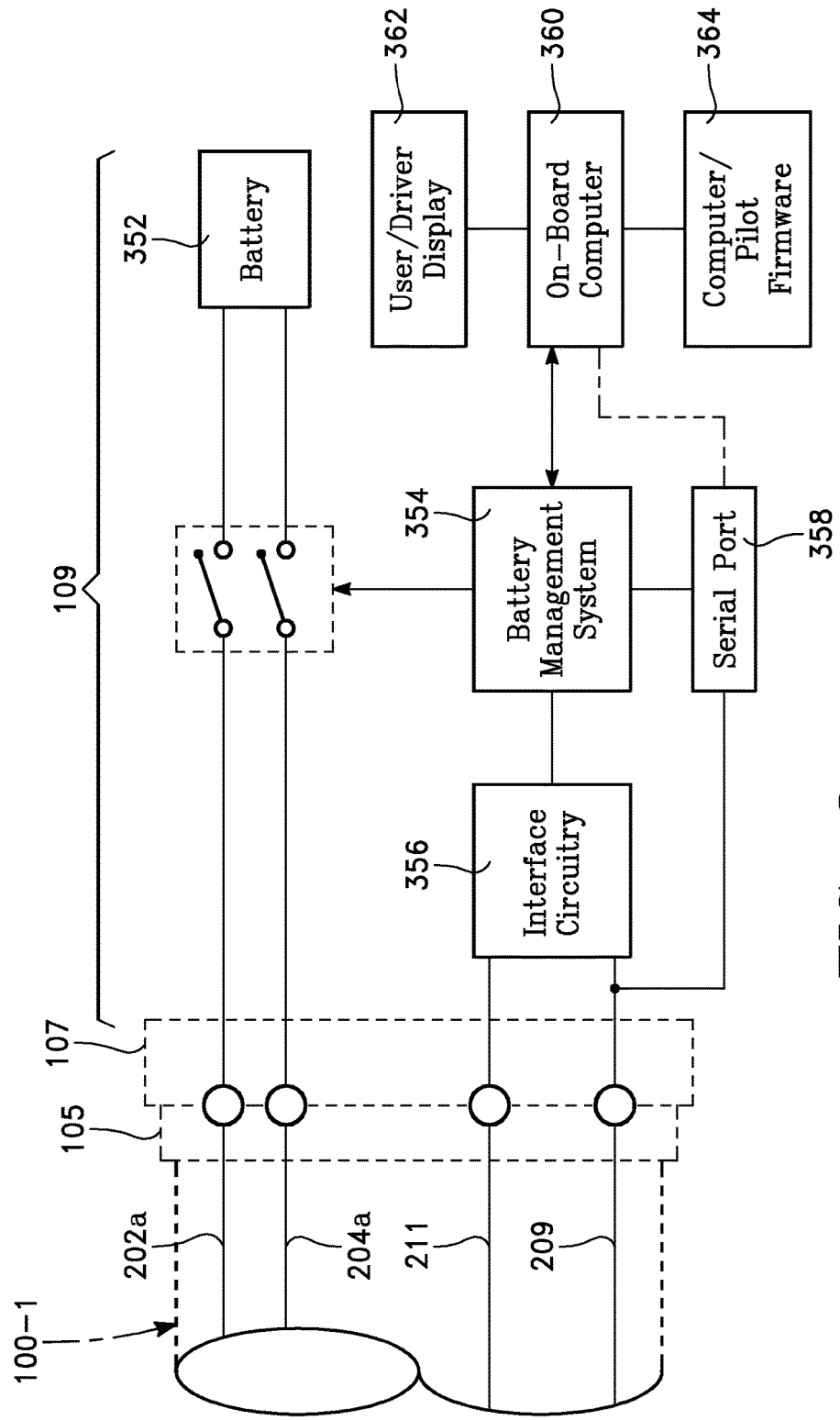
FIG. 3 is a simplified block diagram depicting elements in the charging interface of an EV connected to the portable charging cable of FIG. 1.

FIG. 3 is a simplified diagram depicting certain components of the EV 109 of FIG. 1 and their connection through the EV charging port 107 to the EVSE 100 of FIG. 1. These components include a battery pack 352 and a charge controller or battery management unit 354. In addition, analog circuitry 356 may be provided to enable the charge controller 354 to respond to and impose changes in voltage on the control pilot conductor 209 through the EV connector 107. This feature enables the charge controller 354 to respond appropriately to changes in voltage on the control pilot conductor 209 in accordance with the required communication protocol referred to above.

As described above with reference to FIG. 1, the plug 110 may be configured for insertion into a standard 240 volt A.C. outlet, and an optional 240 volt/120 volt adapter 112 may be tethered to the cable utility end 100b to permit connection to a standard 120 volt A.C. outlet. Thus, the source voltage may be either 120 VAC or 220 VAC.

The in-line controller 115, in one embodiment described below herein, automatically detects (through the sensor 212) the voltage input through the cable utility end 100-2, and ascertains the appropriate voltage range, which is either Level 1 (i.e., 120 VAC±10%) or Level 2 (i.e., 240 VAC±10%). Once the appropriate range has been ascertained, the microprocessor 217 constantly compares the actual voltage measured by the sensor 212 with the appropriate voltage range, and issues an alarm or halts charging whenever (for example) an over-voltage condition occurs. Therefore the portable charging cable 100 can be operated as a Level 1 or Level 2 EVSE depending upon the attached plug connector.

Figure 4:
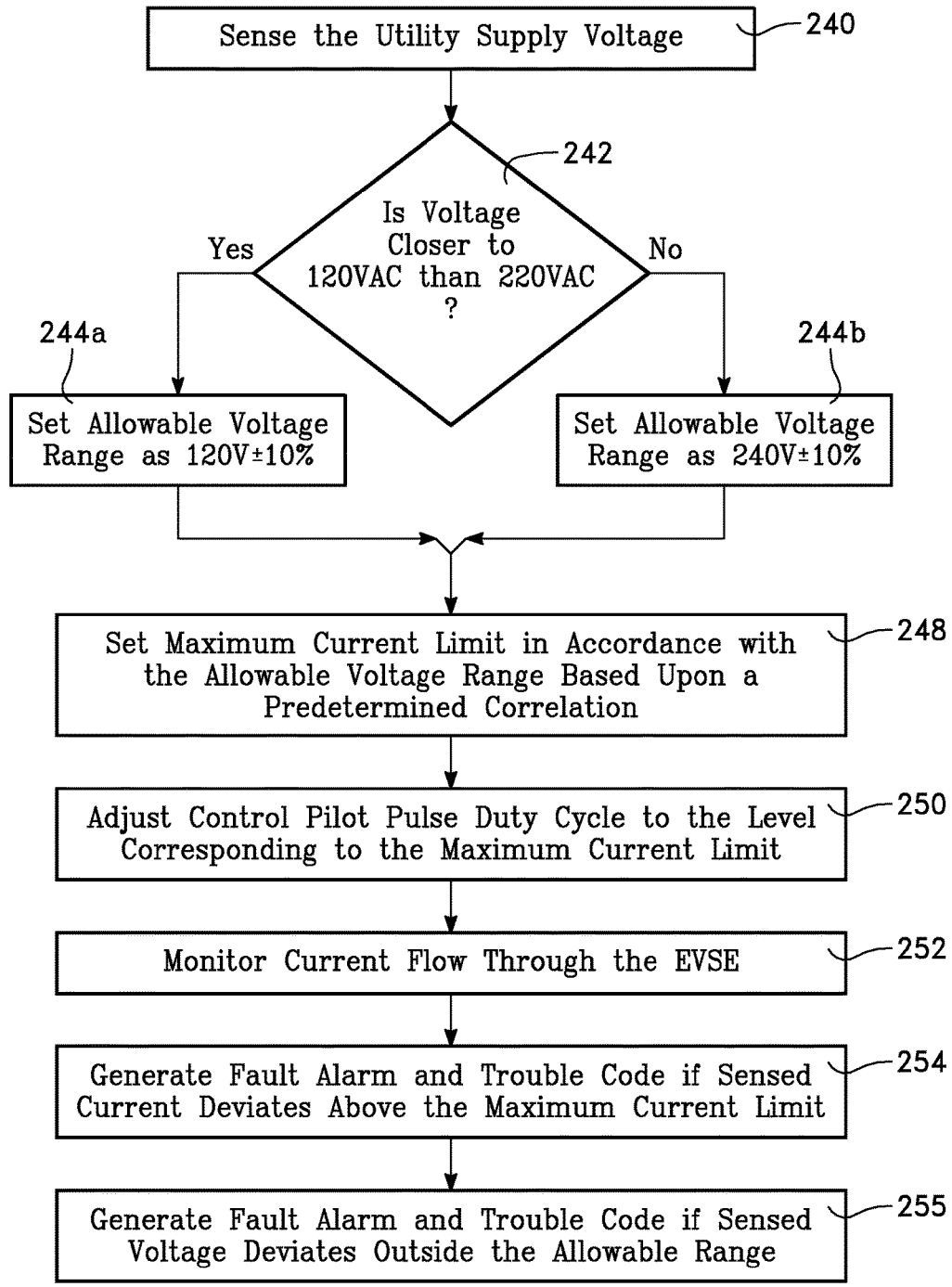
FIG. 4 is a flow diagram depicting a method performed in the embodiment of FIG. 1 for automatically adjusting to different utility supply voltages.

FIG. 4 depicts one method for automatically adapting to the voltage range. In this method, the microprocessor continually monitors the utility supply voltage using the sensor 212 (block 240 of FIG. 4). The microprocessor 217 determines whether the sensed voltage is closer to 120 VAC—"Level 1", or 240 VAC—"Level 2" (block 242). If the sensed voltage is closer to 120 VAC (YES branch of block 242), then the microprocessor 217 establishes the allowable voltage range as 120 VAC±10% (block 244a). If the sensed voltage is closer to 240 VAC (NO branch of block 242), then the microprocessor 217 establishes the allowable voltage range as 240 VAC±10% (block 244b).

In a further aspect, the designer may have established a maximum allowable current level, which may be the same for both possible voltage ranges (i.e., Level 1 and Level 2) or may be different for the two ranges. For example, the maximum allowable current level may be higher for the Level 2 voltage range than for the Level 1 voltage range, to take advantage of the higher current levels allowed by the specification SAE J1772 for Level 2 voltages, and to account for any difference in current ratings between the 240 Volt plug 110 and the tethered 120 Volt adapter 112 of FIG. 1. The microprocessor 217 sets the maximum allowable current level (block 248 of FIG. 4), which may depend upon whether the allowable voltage range is a Level 1 voltage or a Level 2 voltage. The microprocessor 217 sets the pulse generator 222 to a duty cycle corresponding to the maximum allowable current level (block 250).

The microprocessor 217 monitors the current using the output of the sensor 212 (block 252) and produces an alarm and a trouble code if the current exceeds the limit (block 254). The microprocessor 217 continues to monitor the utility supply voltage, and if the sensed voltage deviates outside of the allowable voltage range, the microprocessor 217 generates a fault alarm to the user and stores a corresponding trouble code in the memory 218 (block 255).

In an alternative embodiment, the portable charging cable 100 may be configured to accept only 120 volt A.C. power, and can be provided as a combination of the in-line controller 115 and the docking cable section 100-1 without the utility cable section 100-2. In this alternative embodiment, in place of the utility cable section 100-2 is a socket on the in-line controller 115 for attaching a conventional 120 volt extension cord. In this simplified configuration, a user would be able to charge the EV from commonly available electrical outlets using readily available equipment. In a further configuration of the above embodiment, the extension cord may include GFI (ground fault interrupter) circuitry.

A housing or enclosure 230 provides a permanent waterproof seal around the exterior of the in-line controller 115, as indicated in FIG. 2. The housing 230 may have flat and/or curved exterior surfaces (not shown in FIG. 2). The in-line controller 115 may be an integral part of the cable 100. The housing occupies an intermediate zone of the cable 100 between the docking section 100-1 and the utility section 100-2. Alternatively, each cable section 100-1 and 100-2 may be detachably connected to optional ports 115-1, 115-2, respectively, on opposite ends of the housing 230. In one embodiment, the housing 230 may be integrated with (or sealed with) the exterior surfaces of the cable docking section 100-1 and the cable utility section 100-2. The housing 230 may comprise a plastic or metal enclosure. The interior of the housing 230 may contain the electronic and electrical components of the type depicted in FIG. 2. In addition, a potting compound may fill the empty spaces inside the housing 230 and thereby provide thermal conduction from the interior components to the exterior of the housing 230. In one embodiment, the housing 230 may be formed by potting the components of the in-line controller 115 with a potting compound. The embodiments of the housing 230 are described later in this specification.

The housing 230 is an integral part of the cable 100 and is freely suspended between the cord docking and utility sections 100-1, 100-2 whenever cord is lifted or moved, so that the entire cord 100 including the housing 230 behaves mechanically as a single integrated cord during handling or moving. The housing 230 is sufficiently small and light to behave as an integral part of cord during handling. In embodiments, the housing 230 may have length in the range of 5-6 inches, a width in the range of 3-4 inches and a height in the range of 1.0-2.5 inches. The cord docking section 100-1 may be about 15-25 feet long. The cord docking and utility sections 100-1, 100-2 have circular cross-sections of diameter between 0.25 and 1.0 inch, while the housing 230 has a rectangular cross-section.

File Uploading/Downloading Via Control Pilot Serial Port:

One advantage of permanently sealing the components of the in-line controller components within the housing 230 is that the in-line controller 115 is protected from moisture, mechanical shock, electrical shock and tampering. However, this feature prevents accessing the electronic components of the in-line controller 115. This would prevent, for example, conducting simple tests or fetching information from the memory 218 to determine, for example, whether the firmware or computer programs stored in the memory 218 are the latest version. Such encapsulation also prevents uploading new software into the memory 218 or replacing existing software.

Figure 5:
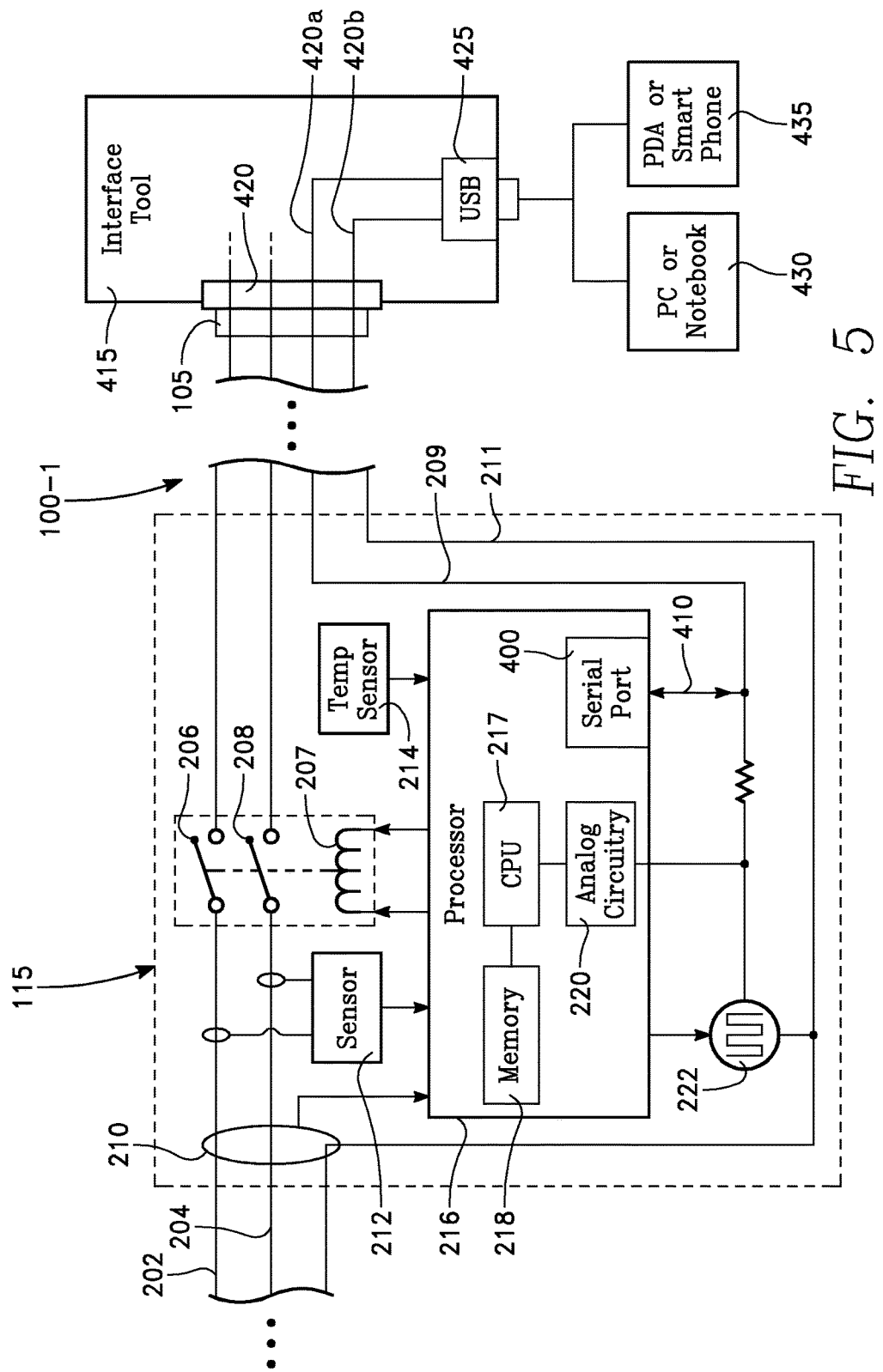
FIG. 5 is a simplified block diagram depicting an embodiment in which the portable cable facilitates file uploading from an external computer through a special interface tool.

This limitation is overcome by providing for serial data transfer from and to the microprocessor 217 over the control pilot conductor 209. Referring now to FIG. 5, the microprocessor 217 has a serial port 400 that provides serial data transfer in accordance with a suitable serial data transfer protocol such as Universal Serial Bus (USB) or RS232. The appropriate driver firmware may be stored in the memory 218 to enable the microprocessor 217 to implement data transfer via the control pilot conductor 209 in both directions. A serial bus or conductor 410 connects the serial port 400 with the control pilot conductor 209. The control pilot conductor 209 thus functions as (A) a communication channel for the analog D.C. voltage level changes by which the EVSE and the EV communicate with each other and (B) a two-way serial bus for digital communication.

External access to the serial port 400 via the control pilot conductor 209 is provided through a stand-alone interface tool 415 shown in FIG. 5. The interface tool 415 has an interface tool connector port 420 able to mate with the EVSE connector 105 whenever the EVSE connector 105 is not mated to the EV charging port 107. Whenever the EVSE connector 105 is mated with the interface tool connector port 420, one pin 420a of the interface tool connector port 420 is coupled to the control pilot conductor 209, while a second pin 420b is coupled to the neutral conductor 211. A user-accessible serial port 425, such as a USB port, is provided on the interface tool 415 and is connected to the pins 420a and 420b through internal conductors inside the interface tool 415.

Whenever it is desired to communicate with the microprocessor 217 or verify contents of the memory 218 or to perform file transfers (e.g., to upload a latest revision of firmware) to the microprocessor 217 and/or memory 218, the EVSE connector 105 is disconnected from the EV charging port 107 and connected instead to the interface tool connector port 420. The interface tool connector port 420 provides for connection between the control pilot conductor 209 and the user-accessible serial port 425. The serial port 425 may be implemented as a USB connector which may be connected to a computer 430 (e.g., a personal computer or a notebook computer) or to a handheld programmable communication device 435, such as a PDA (personal digital assistant) or a smart phone or equivalent device. Both the processor 216 and the computer 430 (or PDA 435) contain respective firmware program instructions that enable a user to perform various tasks, such as downloading and interpreting EVSE trouble codes, verifying the software version of programs stored in the memory 218, deleting obsolete software stored in the memory 218 and uploading updated versions of the software from the computer 430 or PDA 435 to the memory 218. The character representation of each EVSE trouble code and the conditions under which it is to be issued by the microprocessor 217 are predetermined by the system designer.

In some cases, provision may be made for the EV 109 to transmit diagnostic trouble codes to the EVSE. In this case, if the EVSE is the portable charging cable 100 of FIG. 1, these trouble codes may be stored in the memory 218 of the in-line controller 115, and later (when the EV 109 and EVSE 100 are no longer connected) downloaded through the interface tool 415 for evaluation or diagnosis by a technician.

The interface tool 415 may be provided as a portable tool that the user may store at home. The interface tool 415 may be provided as standard equipment stored in the EV along with the portable charging cable 100. The interface tool 415 may be provided in a kiosk at a vehicle dealer for example, that can be visited by the user. The interface tool 415 may be provided as a professional technician's tool for use by repair facilities or dealers. In this latter case, the interface tool 415 may include most or all of the functionality of a computer 430 (including a microprocessor and memory, a display, and program firmware for downloading and interpreting trouble codes), so as to be a self-contained hand-held diagnostic tool. Software updates may be obtained by the computer 430, the handheld communication device 435, or by the interface tool 415 itself, via a communication channel such as a dedicated radio link, a local area network or via the internet.

Figure 5A:
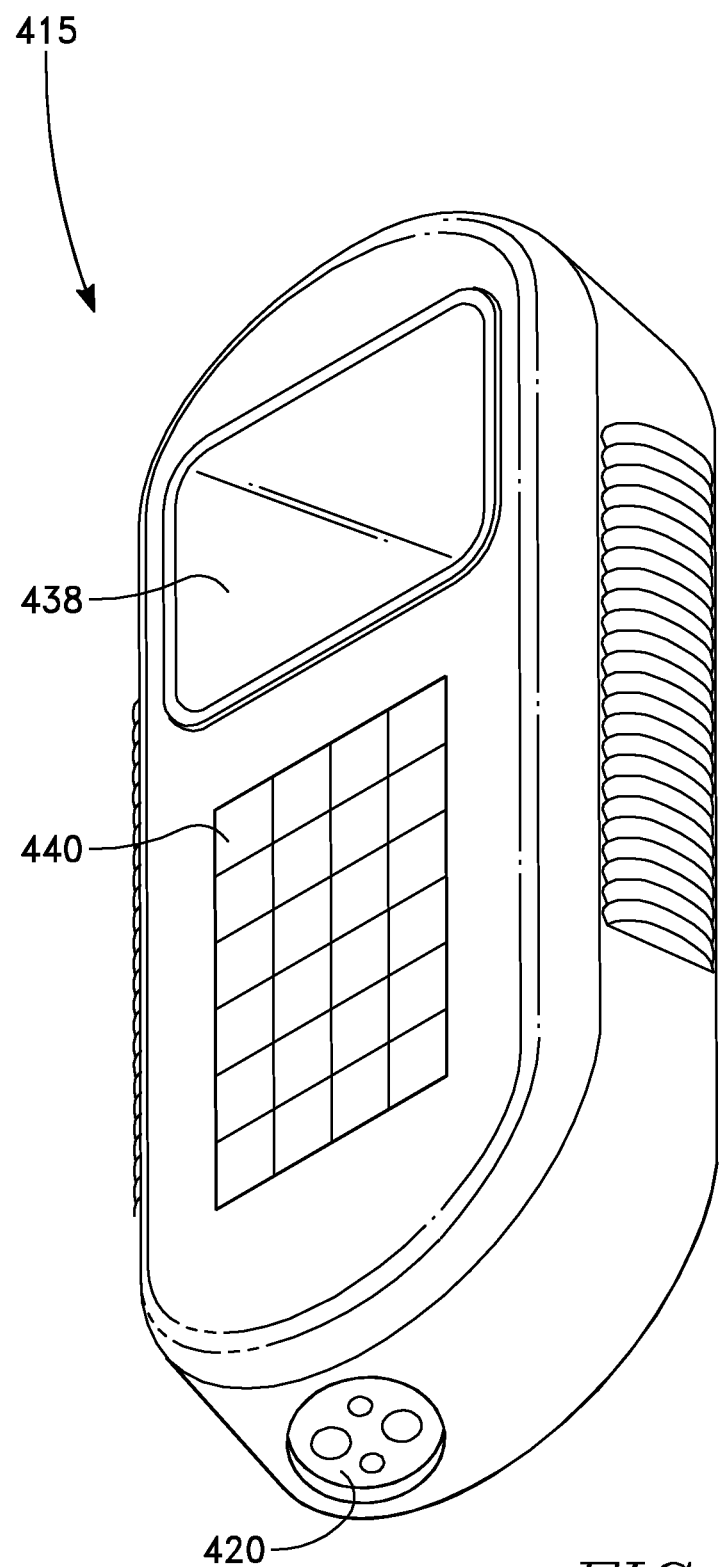
FIG. 5A is an orthographic view of a robust handheld embodiment of the special interface tool of FIG. 5.
Figure 5B:
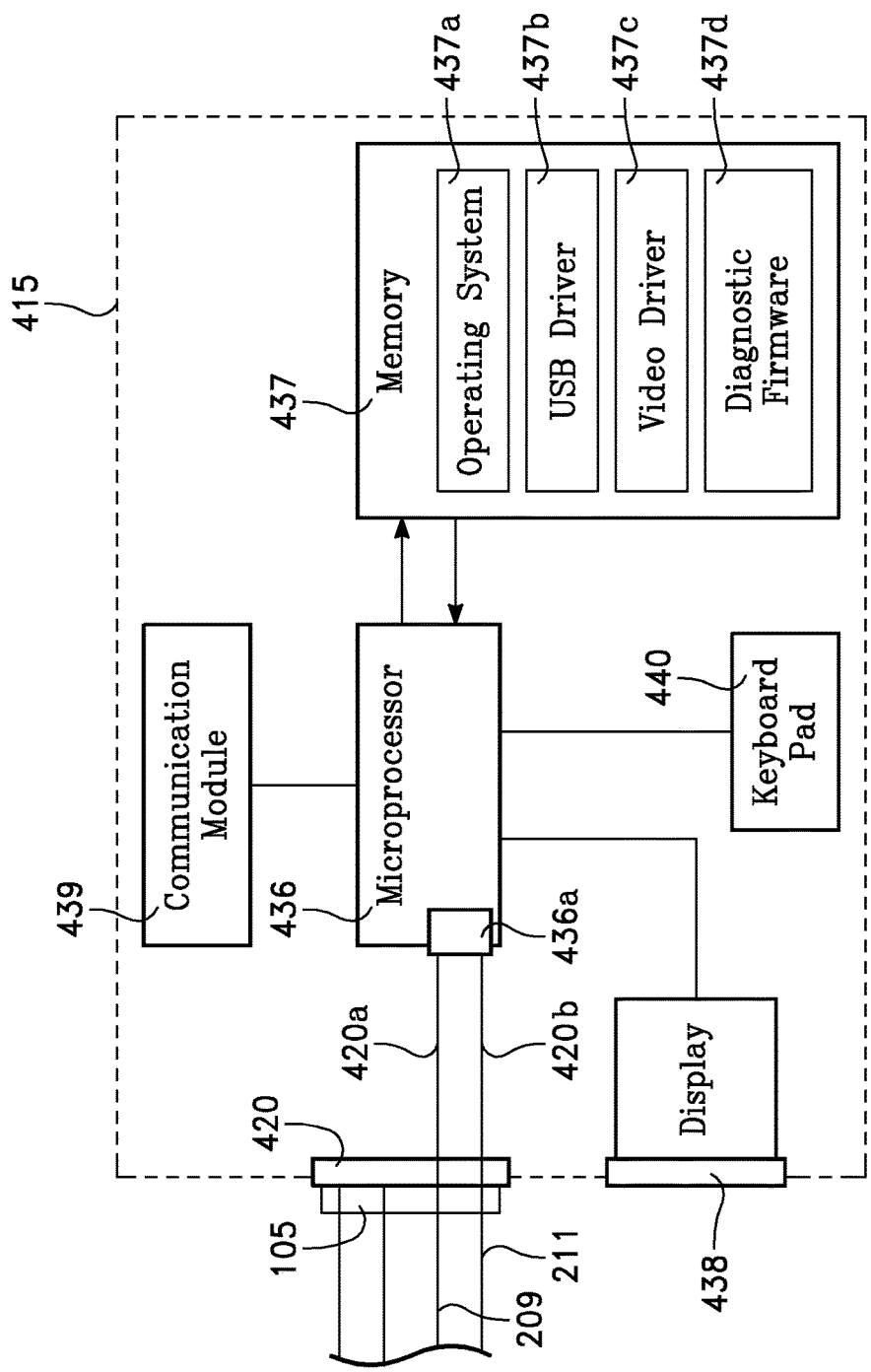
FIG. 5B is a simplified schematic block diagram of the special interface tool of FIG. 5A.

FIGS. 5A and 5B depict a versatile handheld embodiment of the interface tool 415. FIG. 5A depicts how the interface tool may be shaped while FIG. 5B depicts its internal architecture. In FIG. 5A, the interface tool 415 includes the connector port 420. The connector port 420 may be compatible with the type specified by the Society of Automotive Engineers Specification SAE J1772, for connection to the docking connector 105 of the EVSE 100 of FIGS. 1-3 and 5. The interface tool of FIGS. 5A and 5B further includes a microprocessor 436, a memory 437 and a display or video monitor screen 438. The microprocessor 436 includes a serial port 436a that is connected to the connector port pins 420a, 420b to facilitate communication with the EVSE's microprocessor 217. The microprocessor 436 controls the display 438 and is coupled to the memory 437. The memory 437 stores firmware including an operating system 437a, a USB driver 437b for communication with the EVSE's microprocessor 217 and a video driver 437c for controlling the display 438. In addition, the memory 437 may store diagnostic firmware 437d enabling the microprocessor 436 to interpret trouble codes and status data received from the EVSE microprocessor 217 and to generate representative images on the display 438 that enable the user to understand the status of the EVSE 100 and to understand the trouble codes. A communication module 439 coupled to the microprocessor 436 enables the microprocessor 436 to access new information via a communication network such as the internet or a local area network (e.g., within a facility such as a vehicle dealership). For example, the communication module 439 may include conventional wireless local area networking hardware. A keypad 440 may be provided on the interface tool 415 to enable the user (e.g., a technician) to enter commands to the EVSE microprocessor 217 (e.g., requesting a particular data transfer or information) and/or to respond to prompts on the display 438 generated by the diagnostic firmware. The display 438 may be a touch screen, enabling the user to communicate to the microprocessor 436. In this case, the key pad 440 may not be required.

The information obtained from the EVSE 100 by the interface tool 415 may include the current status of the EVSE 100 (e.g., temperature within range, supply voltage within range, frequency within range, no GFE faults, etc.). This information may be displayed on a monitor of the computer 430 or on a display screen of the PDA 435, for example. Or, if the interface tool 415 is the versatile embodiment of FIGS. 5A and 5B, then the information may be displayed on the screen or display 438 of the interface tool 415.

In an alternative embodiment, the information obtained from the microprocessor 217 via serial data communication on the control pilot conductor 209 may be displayed on the driver's display of the EV 109. This would be possible whenever the EVSE docking connector 105 is connected to the EV charging port 107, not to the interface tool 415. In such a case, an on-board computer of the EV 109 may be programmed to obtain the information through the EV battery management system. With regard to such a feature, the EV 109 of FIG. 3 includes a serial port 358 that is coupled to the control pilot conductor 209 of the EVSE 100 whenever the EVSE 100 is connected to the EV 109. In addition, FIG. 3 depicts further elements of the EV 109, including an on-board computer 360 and an EV driver display 362 controlled by the on-board computer 360. The on-board computer 360 may access firmware 364 that enables it to communicate with the battery management system 354 to obtain information via the serial port 358 (or the on-board computer 360 may communicate directly with the serial port 358). In this way, during the time that the EV 109 is being charged by the EVSE 100, information concerning the status of the EVSE 100 may be displayed on the EV driver display 362. As noted above, the displayed information may include current status of the EVSE 100, a history of past trouble codes, identification of the firmware version stored in the EVSE memory 218, and related information.

Figure 6A:
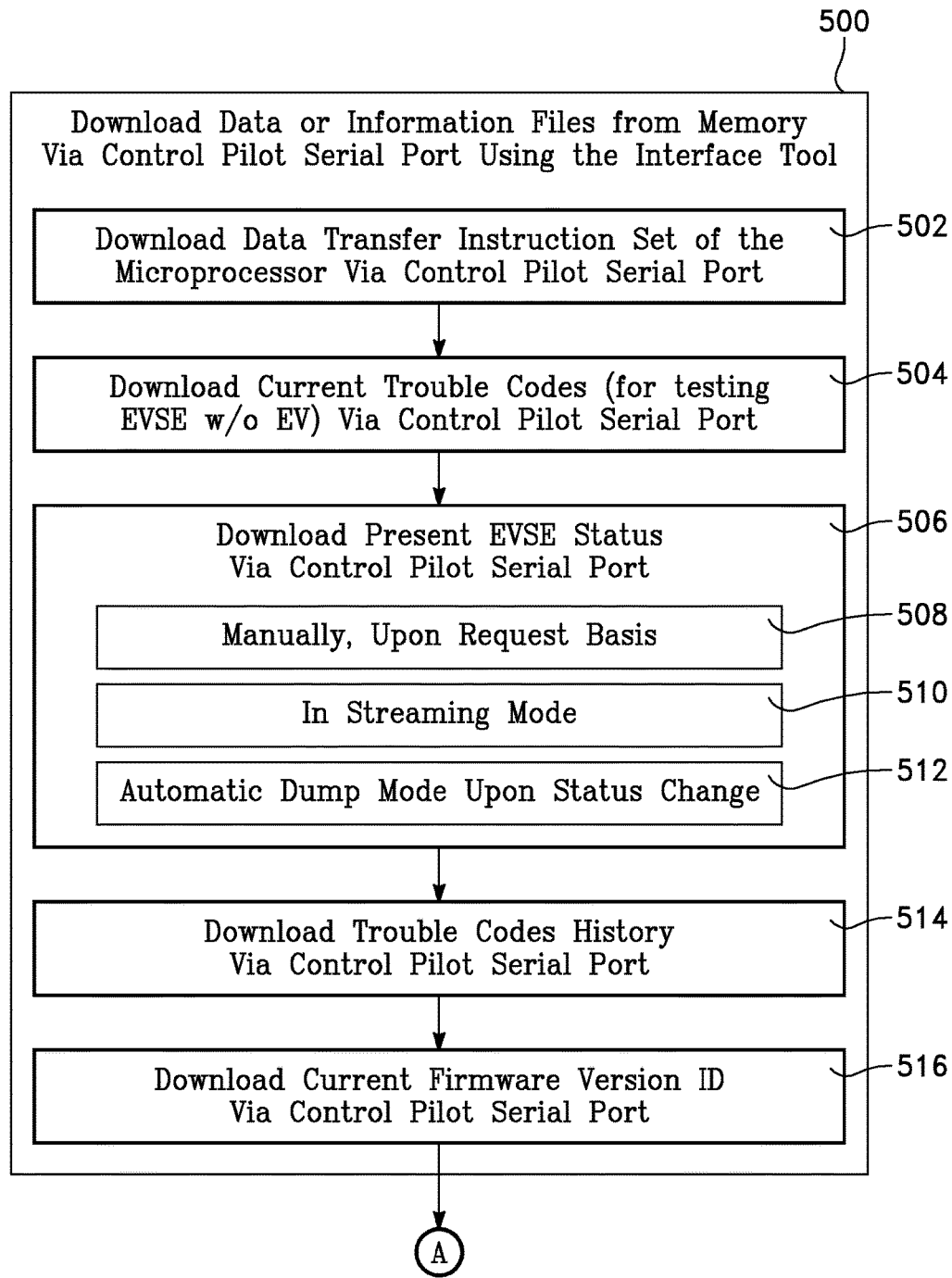
FIGS. 6A and 6B together constitute a flow diagram depicting methods of operation in the embodiment of FIG. 5.
Figure 6B:
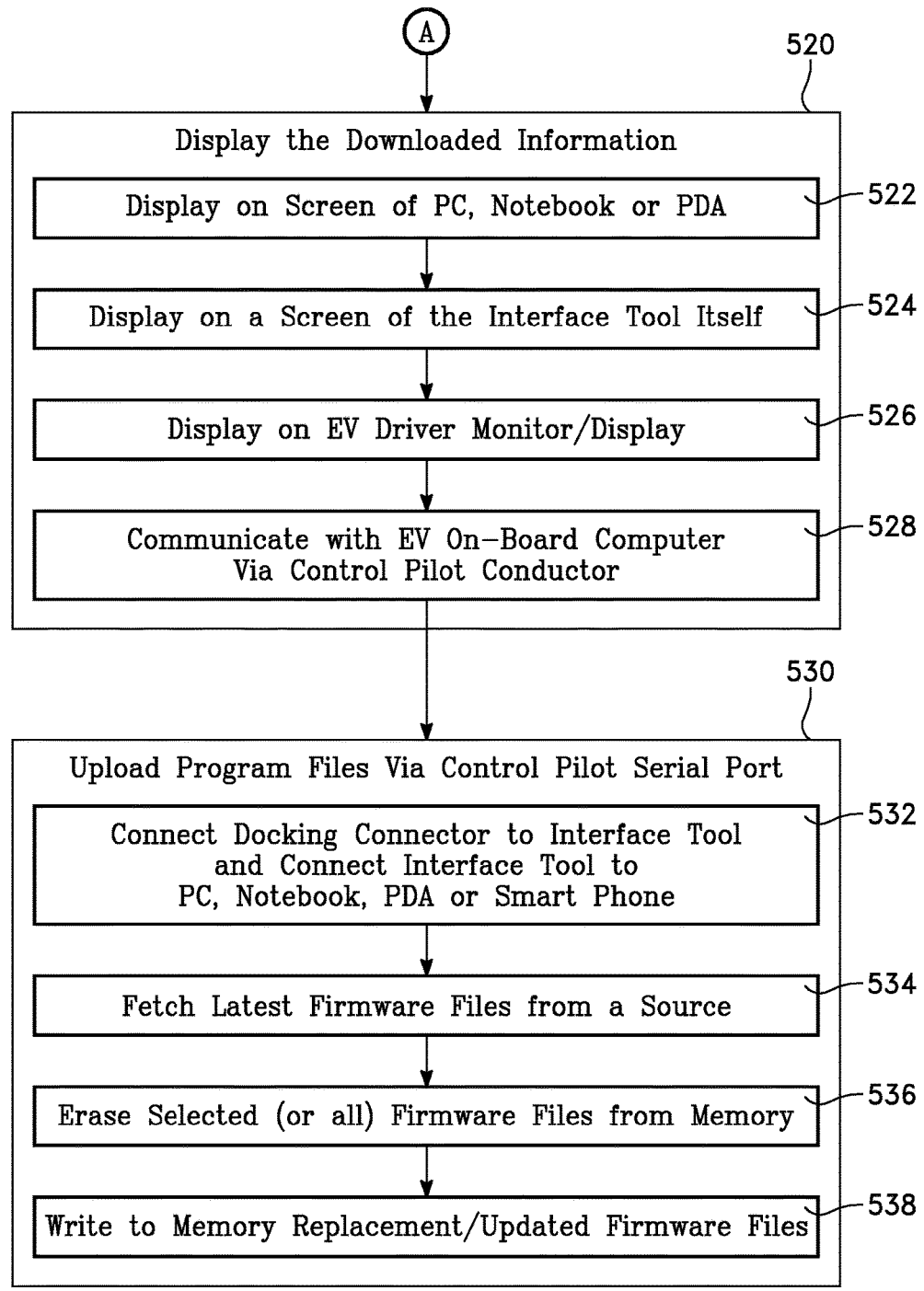

FIGS. 6A and 6B depict methods using the control pilot conductor as a serial bus to communicate digital information to and from the EVSE memory 218 and microprocessor 217 using the interface tool 415 of FIG. 5A with the computer 430 or using the interface tool of FIGS. 5A and 5B. The operations depicted in FIGS. 6A and 6B rely upon the EVSE memory 218 containing certain components as depicted in FIG. 7.

Figure 7:
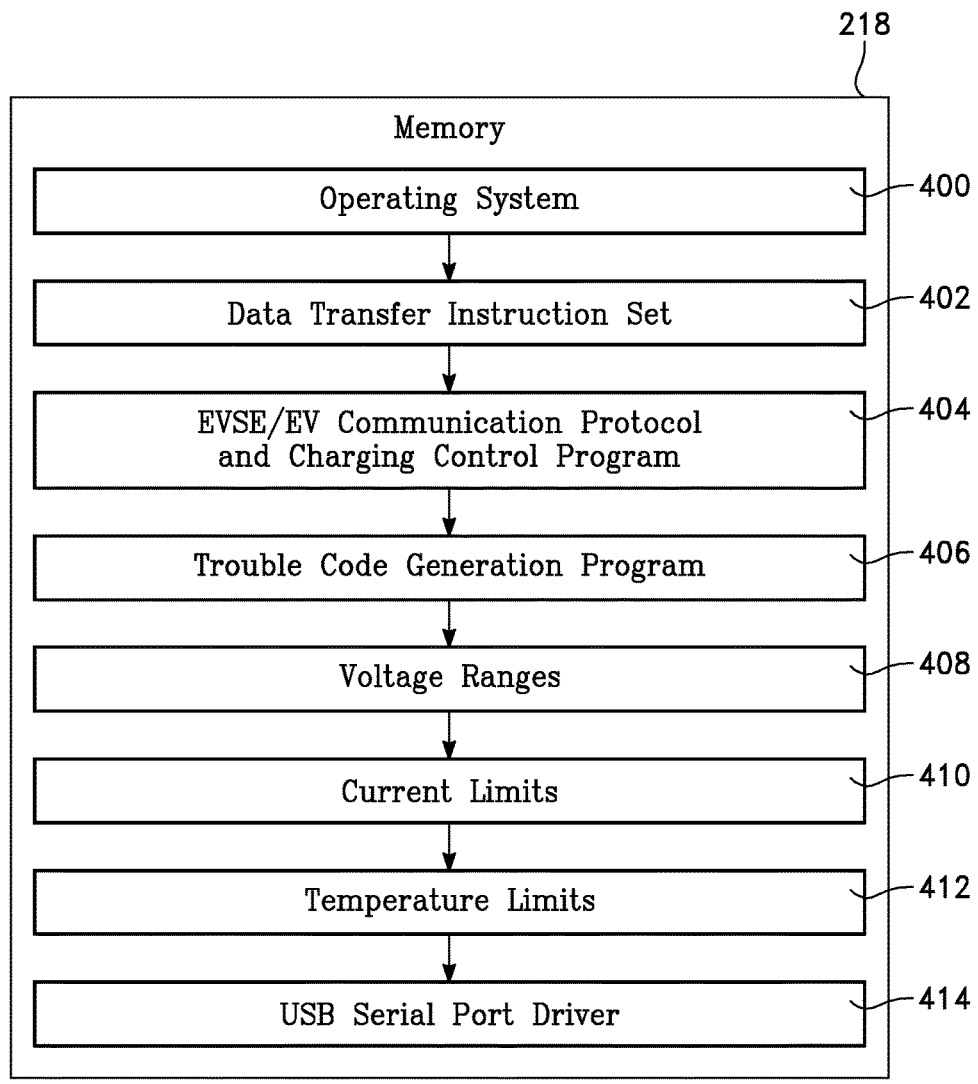
FIG. 7 is a block diagram depicting the contents of a memory used in the methods of FIGS. 6A and 6B.

Referring to FIG. 7, the components stored in the memory 218 may include an operating system 400, and a set of instructions 402 that may be used control the microprocessor 217 to perform particular data transfer operations. These operations may include downloading specified information in the memory 218, erasing specified locations in the memory 218, and uploading new files to specified locations in the memory 218. The components stored in the memory 218 may further include a firmware package or program 404 that enables the microprocessor 217 to perform the required communication protocols and charge the EV 109 in accordance with the required procedures. The memory 218 may further contain a program 406 that enables the microprocessor 217 to generate appropriate trouble codes whenever a fault (or condition violating the requirements of a controlling specification) is detected. The memory 218 may also contain a list of allowed voltage ranges 408, current limits 410, temperature limits 412 and a may contain a USB driver 414.

Referring again to FIGS. 6A and 6B, a first operation (block 500) is to download data or information files from the memory 218 to the computer 430 via the control pilot conductor 209 serial port 400 using the interface tool 415. There are various tasks this operation can perform. A first task may be for the computer 430 to download the data transfer instruction set of the microprocessor 217 via the serial port 400 (block 502). This would enable the user to select the proper instruction to command the microprocessor 217 to perform specific data transfer tasks. One such task may be to download current trouble codes (block 504), which may be used, for example, in testing the EVSE 100 in the absence of the EV 109. Another task may be to download the present EVSE status (block 506). This task may be performed in one of three modes, depending upon the command asserted by the computer 430: (1) manually, upon request (block 508), (2) continuously, in streaming mode (block 510), and (3) an automatic dump of information upon status change (block 512).

A further download task may be to download the entire history of trouble codes stored in the memory 218 (block 514). Another download task may be to download from the memory 218 the identity (or date) of the firmware currently stored in the memory 218 (block 516) to determine whether it has been superseded or needs updating.

A next operation using the control pilot conductor 209 as a serial data bus is to display the downloaded information (block 520). This operation may use the display on a screen of the computer 430 or on a display or screen of the PDA 435 (block 522). The downloaded information may be displayed on the interface tool display screen 438 of FIG. 5A (block 524). In an alternative embodiment, the downloaded information is displayed on the EV driver display 362 of FIG. 3 (block 526 of FIG. 6). In this embodiment, the EVSE docking connector 105 is connected to the EV charging port 107, not to the interface tool 415. The information to be displayed is communicated to the EV on-board computer 360 via the control pilot conductor 209 (block 528).

A third type of operation is to upload program files to the memory 218 via the control pilot conductor 209 (block 530). The uploaded files may be furnished from a computer 430 or PDA 435 connected to the interface tool 415. Alternatively, the uploaded program files may be furnished by the interface tool 415 itself, using its communication module 439, for example. A first step is to connect the docking connector 105 to the interface tool 415. If necessary, the interface tool 415 is connected to the computer 430 or PDA 435, in the manner illustrated in FIG. 5 (block 532). The next step is for the computer 430 (or PDA 435) to obtain the latest firmware files from a source, for example over the internet (block 534). The memory 218 may be cleared by erasing selected (or all) firmware files previously loaded into the memory 218 (block 536). The operation is completed by writing the new files to the memory 218 (block 538).

Because of the compact size and insulation of the in-line controller 115, it may operate at fairly high internal temperatures, which need to be controlled in order to avoid overheating. In accordance with a further aspect, the microprocessor 217 may be programmed to prevent shutdown of the charging operation due to overheating of the in-line controller 115 of FIG. 1. It does this by reducing the charging current before the temperature reaches the maximum allowed limit. Specifically, the EVSE microprocessor 217 (FIG. 2) may be programmed to override the nominal setting of the pulse duty cycle and reduce the duty cycle of the pulse generator 222, in response to the output of the temperature sensor 214 exceeding a predetermined threshold temperature (e.g., 70 degrees C.) that is 10%-30% below the maximum operating temperature of the microprocessor 217 (e.g., 85 degrees C.). It does this so as to reduce the charging current (set by the pulse duty cycle) by an amount proportional to the approach of the measured temperature to the maximum operating temperature of the microprocessor 217 (e.g., 85 degrees C.). The nominal pulse duty cycle is stored in the memory 218 at one location, the predetermined threshold temperature is stored in the memory 218 at another location and the maximum operating temperature is stored in the memory 218 at third location. The reduction in charging current may be by an amount proportional to the rise of the measured temperature above the predetermined threshold temperature. The operation is represented as a series of program instructions stored in the memory 218 and executed by the microprocessor 217, and is illustrated in FIG. 8.

Figure 8:
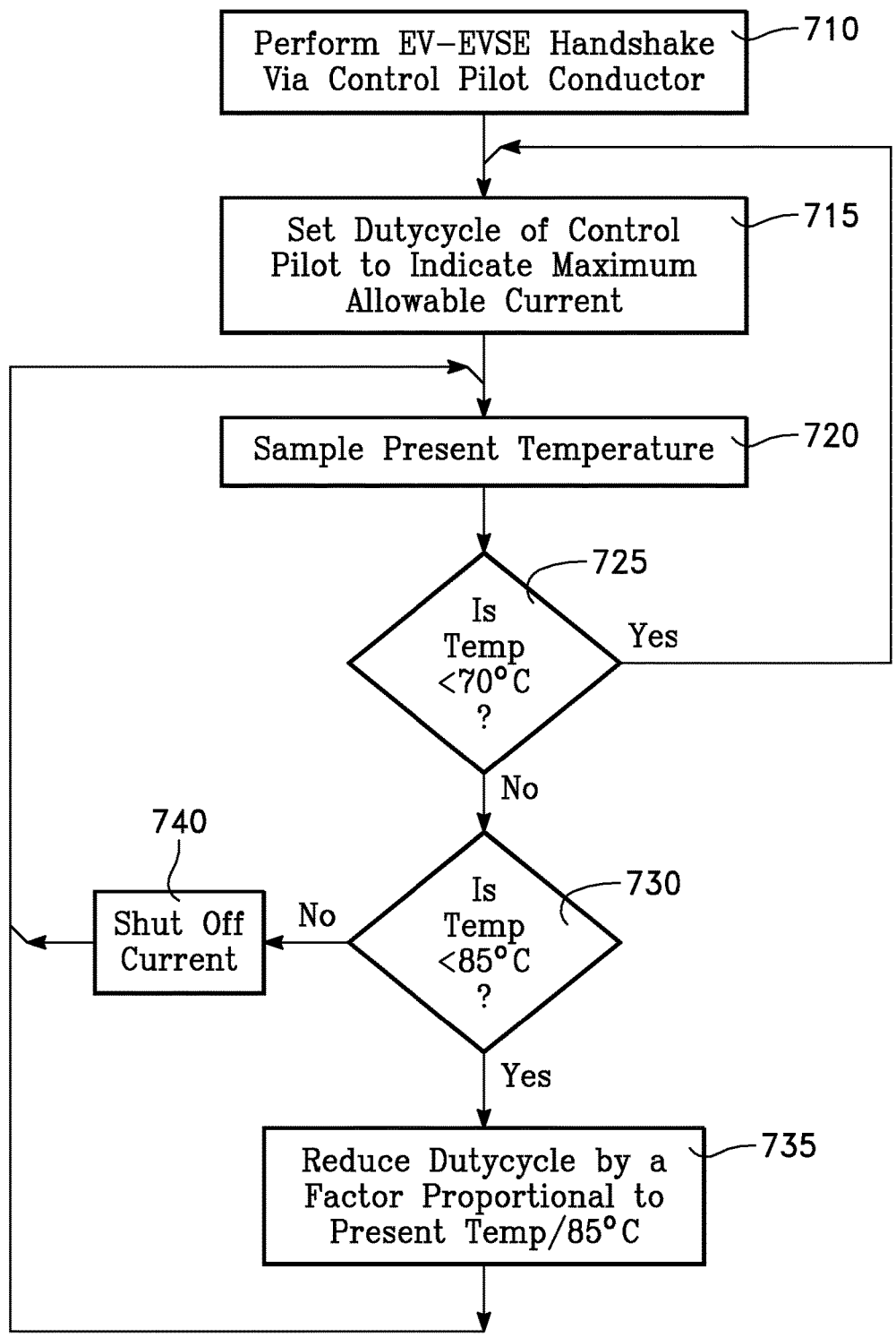
FIG. 8 is a flow diagram depicting methods of operating the embodiments of FIGS. 1-3 for prevention of overheating in the in-line controller of FIG. 1 during EV charging.

Referring now to FIG. 8, the EVSE cable 100 and the EV 109 perform the prescribed handshake protocol via the control pilot conductor 209 after the docking connector 105 has been inserted into the EV charging port 107 (block 710 of FIG. 8). The duty cycle of the pulse generator 222 is set to the maximum allowable current draw that was previously determined by the system designer (block 715). The output of the temperature sensor 214 is sampled to obtain a present temperature of inside the EVSE 100 (block 720). A comparison of the present temperature to the predetermined threshold temperature (e.g., 70 degrees C.) is performed (block 725). If the present temperature is below the predetermined threshold temperature (YES branch of block 725), then the operation returns to the step of block 715. Otherwise (NO branch of block 725), the present temperature is compared with the maximum operating temperature (e.g., 85 degrees C.) in block 730. If the present temperature is less than the maximum operating temperature (YES branch of block 730), then the microprocessor 217 overrides the previously set nominal duty cycle value and reduces the duty cycle from the nominal value by a factor proportional to either the ratio between the measured present temperature and the maximum operating temperature or the difference between them (block 735). In the unlikely event that the measured temperature exceeds the maximum operating temperature (NO branch of block 730), charging is halted (block 740), and the operation returns to the step of block 720. The occurrence of such an event is unlikely because the onset of charging current reduction (block 735) occurs at the predetermined threshold temperature, which is 10% to 30% below the maximum operating temperature. Thus, in the examples provided herein, the predetermined threshold temperature may be 70 degrees C. for a maximum operating temperature of 85 degrees C.

In an exemplary embodiment, the step of block 735 may be performed by reducing the control pilot pulse duty cycle by a factor F, so that the duty cycle is changed from the current duty cycle D by multiplying D by (1−F), so that the new duty cycle is (1−F)D. F depends upon the present temperature sensed by the sensor 214. One example of how to define F is as follows:

$$F=(\text{present temp}-70 \text{ deg C.})/(85 \text{ deg C.}-70 \text{ deg C.}),$$

where "present temp" is the measured temperature from the sensor 214 in degrees C., 85 deg C. is the maximum operating temperature, and 70 deg C. is the predetermined threshold temperature. The skilled worker may use suitable definitions of F other than the foregoing.

Sealed Encapsulating Housing:

In an embodiment, the in-line controller 115 is permanently sealed within the housing 230 from any external moisture or gas. The housing 230 may include elastically deformable materials, such as rubber, that insulate the in-line controller 115 from shock and vibration. In one embodiment, the housing 230 may be filled with a potting compound that provides a thermal path from the electrical and electronic components of the in-line controller 115 to the external surfaces of the housing 230. In another embodiment, the housing 230 itself is formed as a solid volume of potting compound that encapsulates the components of the in-line controller 115.

Figure 9:
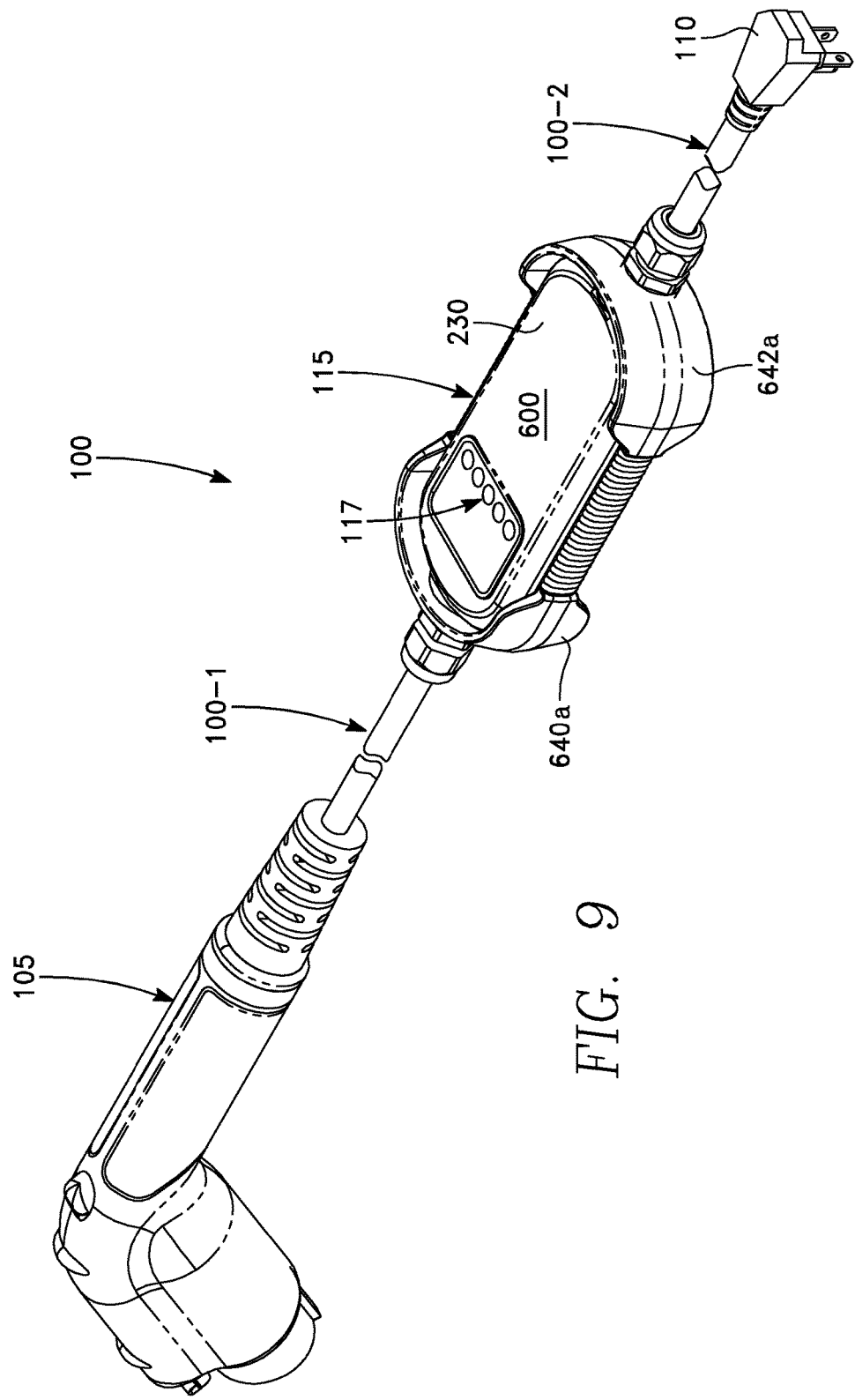
FIG. 9 is an orthographic view of one embodiment.
Figure 10:
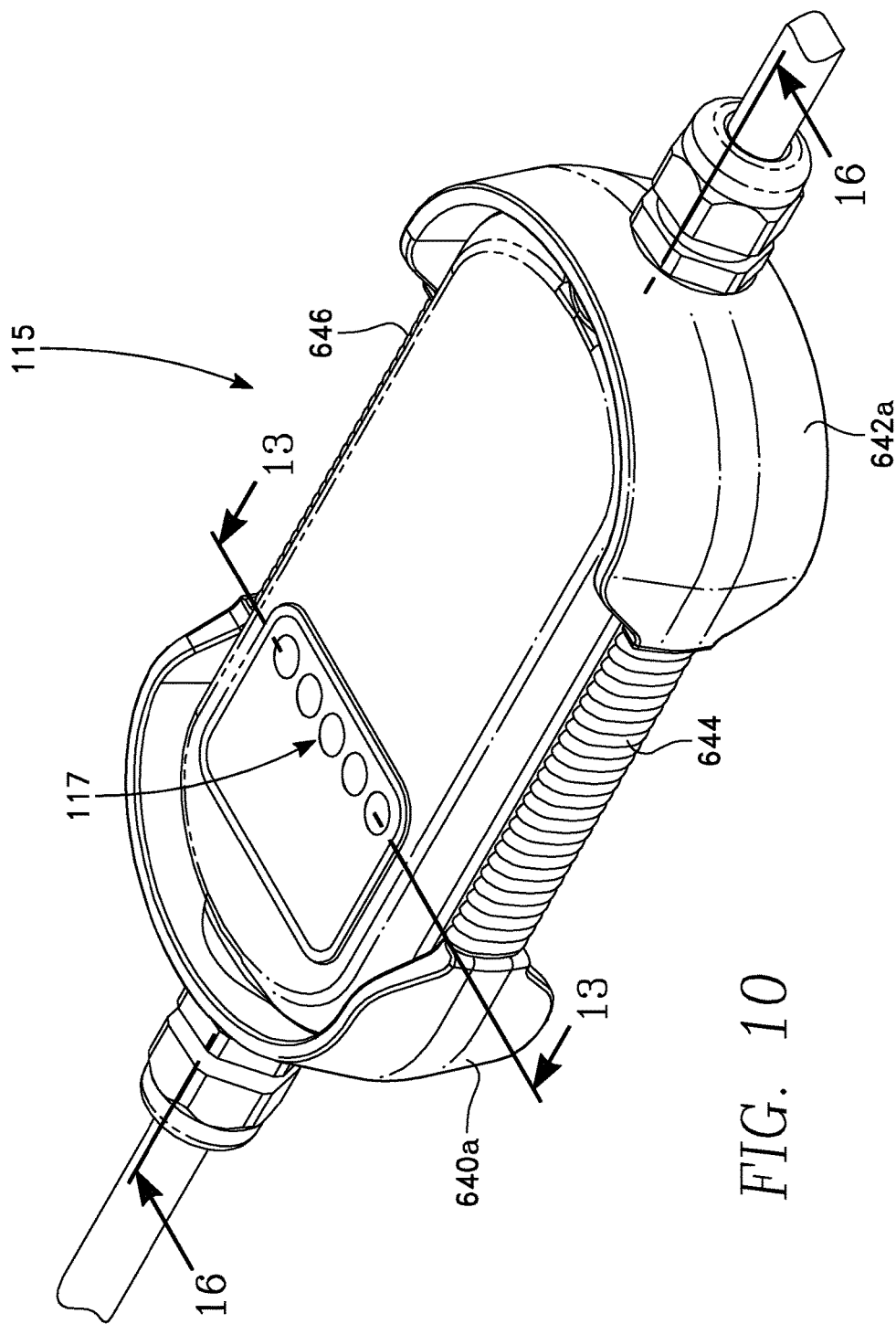
FIG. 10 is an enlarged view corresponding to FIG. 9.
Figure 11:
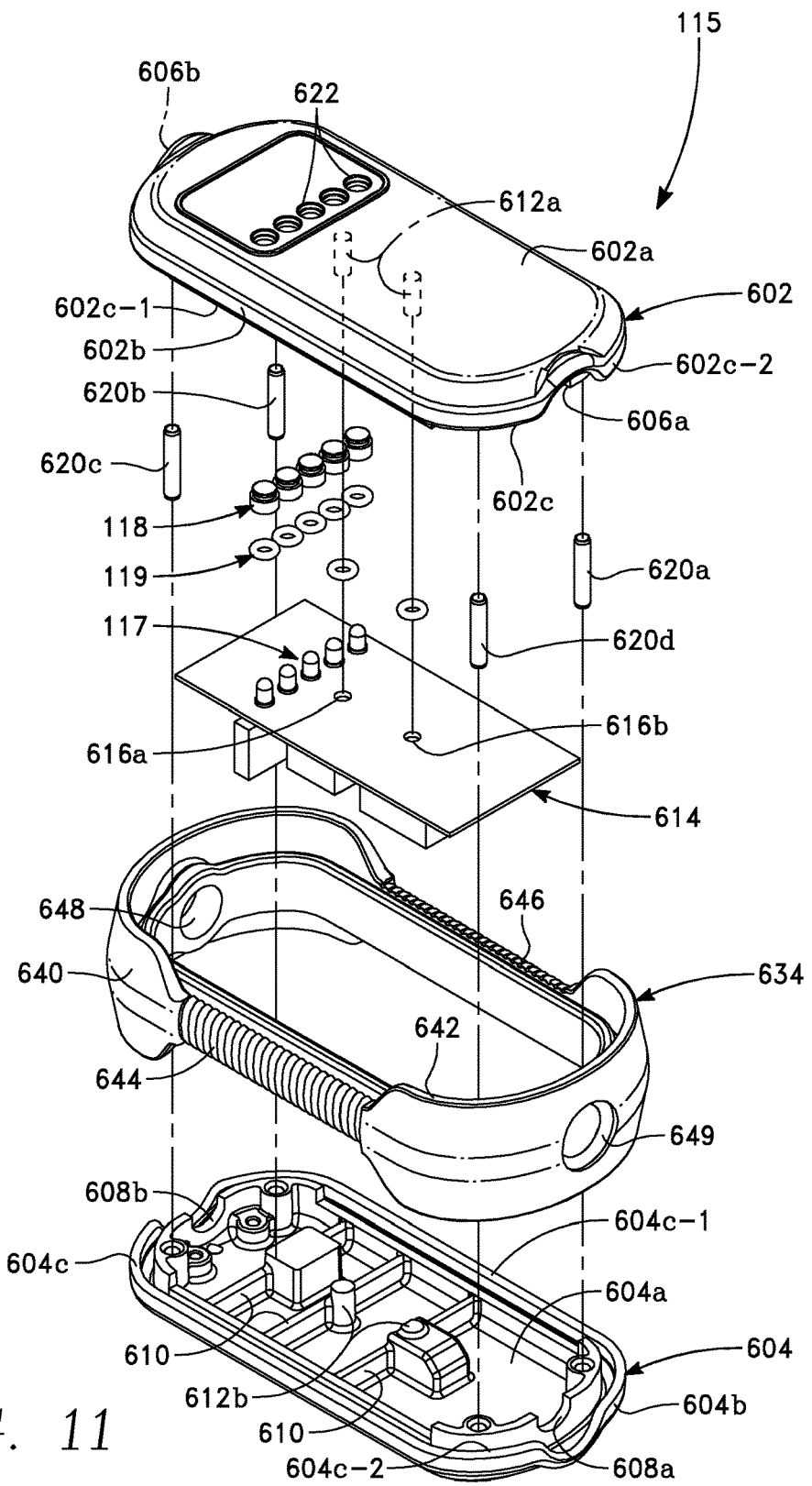
FIG. 11 is an exploded orthographic view of the embodiment of FIG. 10.
Figure 12:
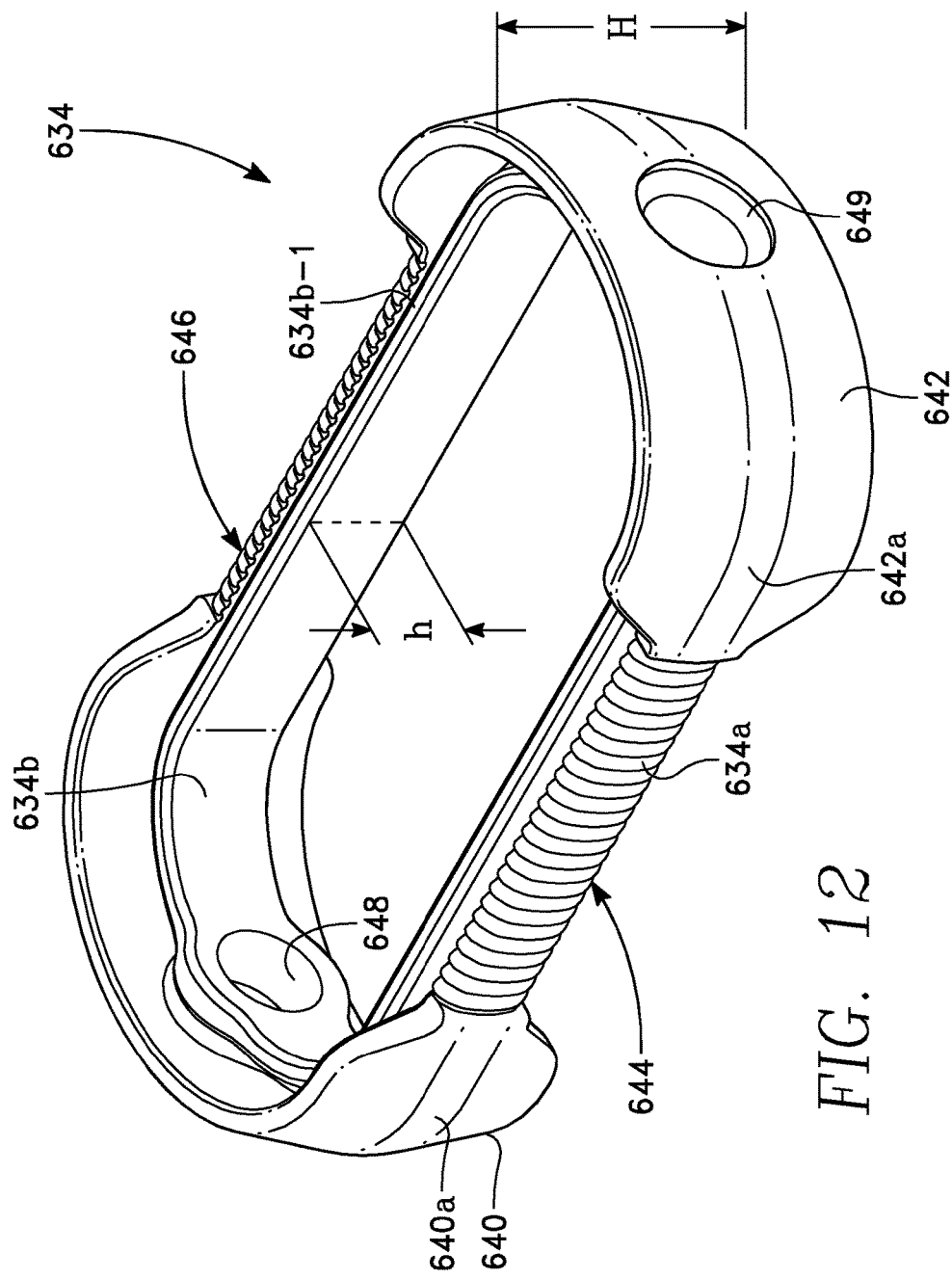
FIG. 12 is an enlarged detailed view of a bumper depicted in FIG. 11.
Figure 13:
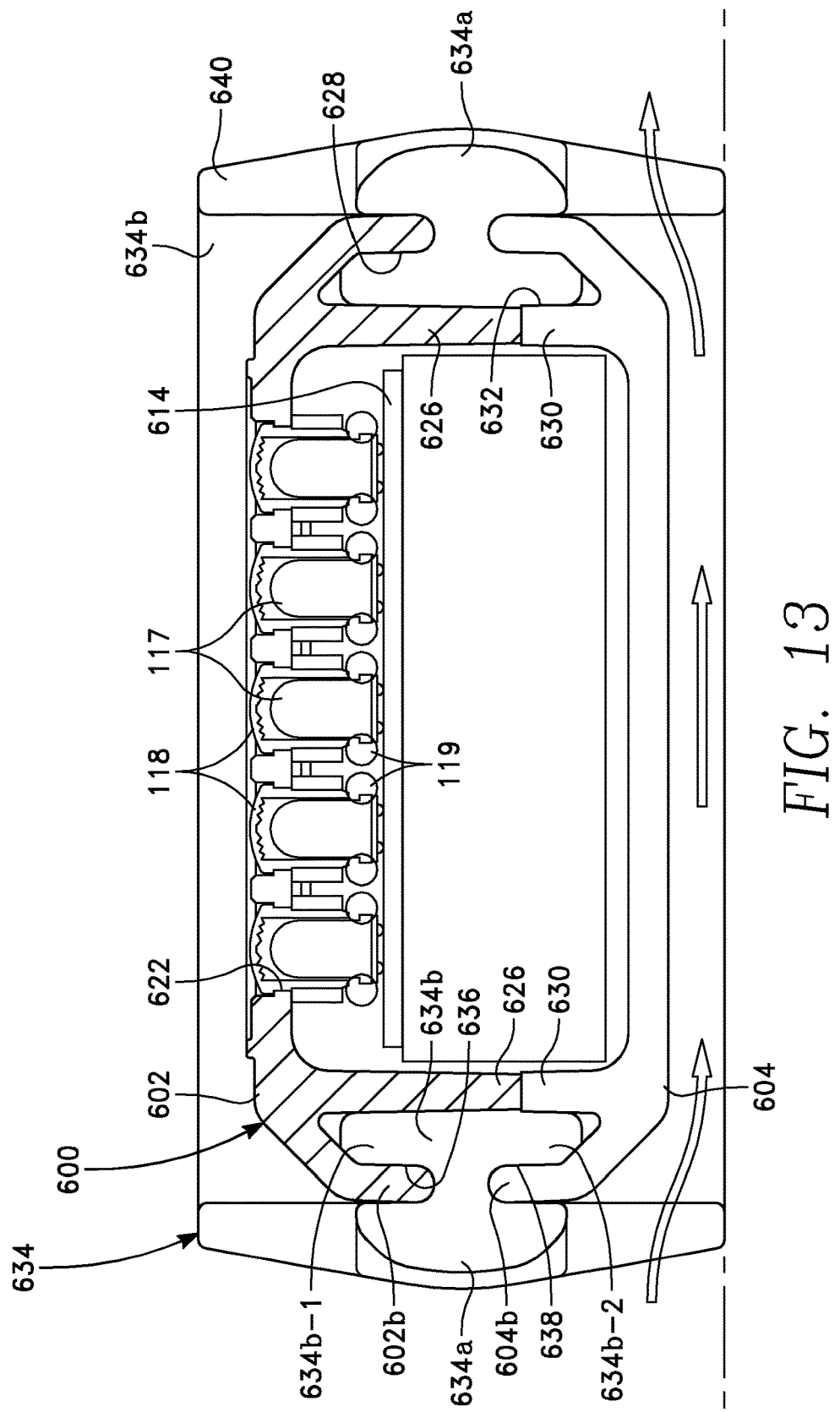
FIG. 13 is a cut-away end view corresponding to FIG. 10.
Figure 14:
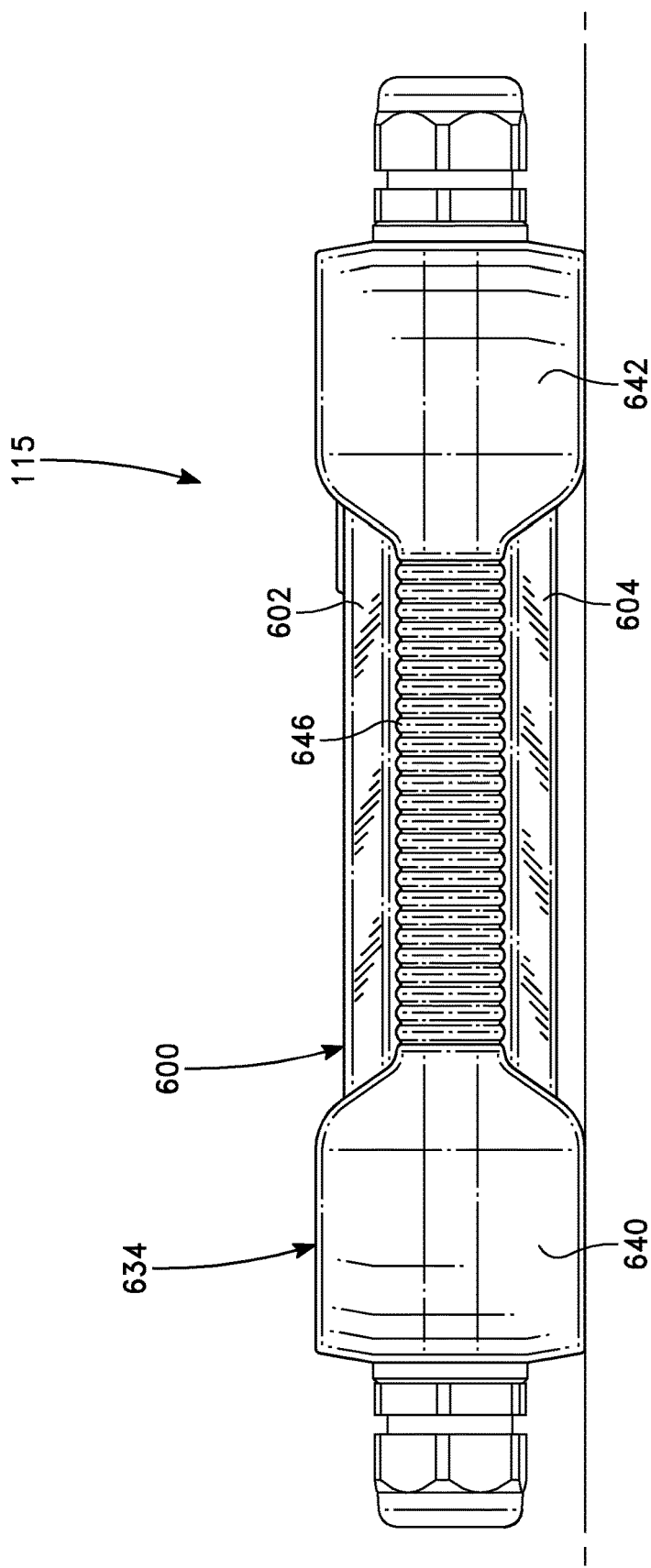
FIG. 14 is an elevational side view corresponding to FIG. 10.
Figure 15:
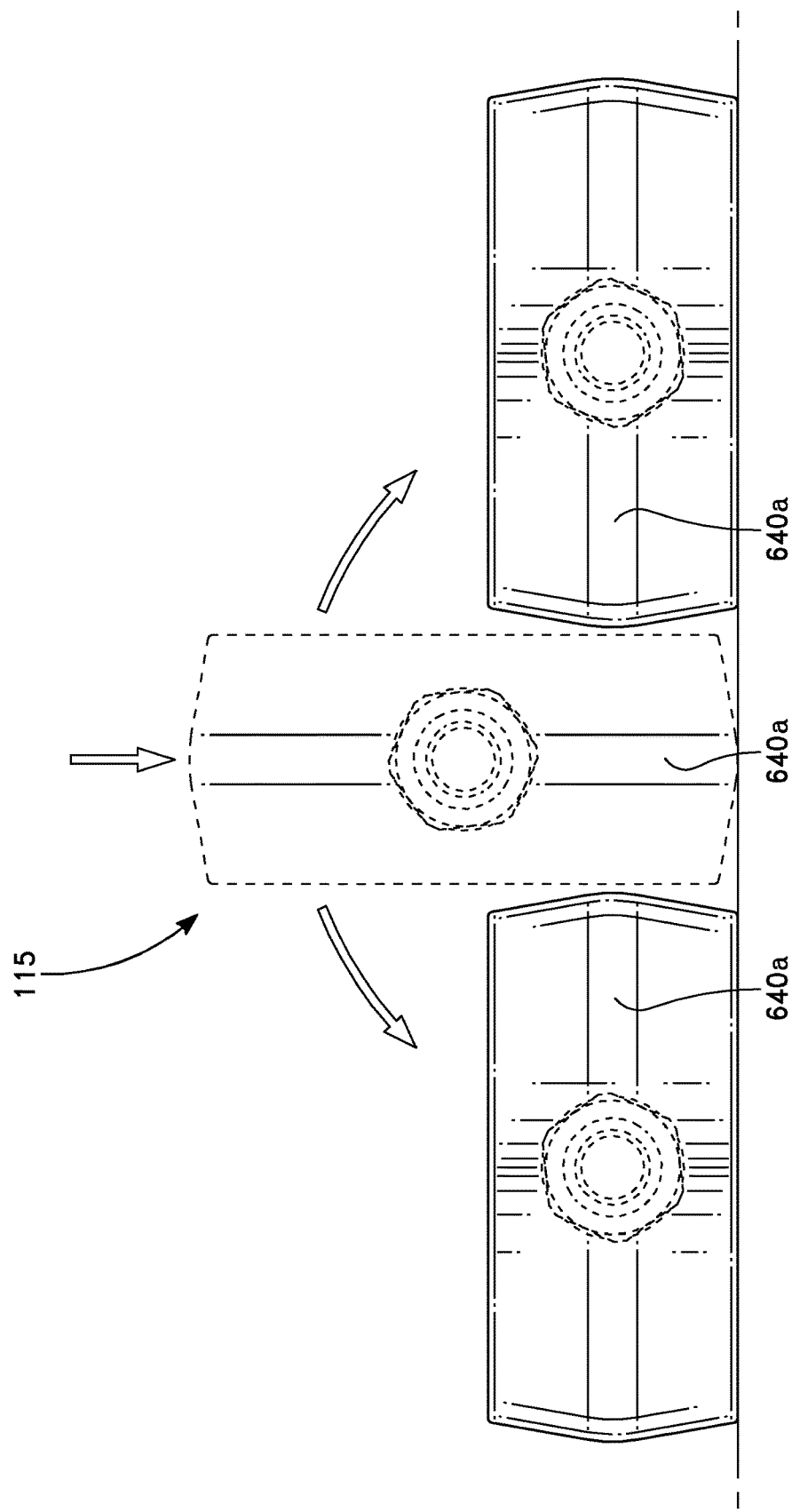
FIG. 15 includes elevational end views corresponding to FIG. 10 at different rotational positions.
Figure 16:
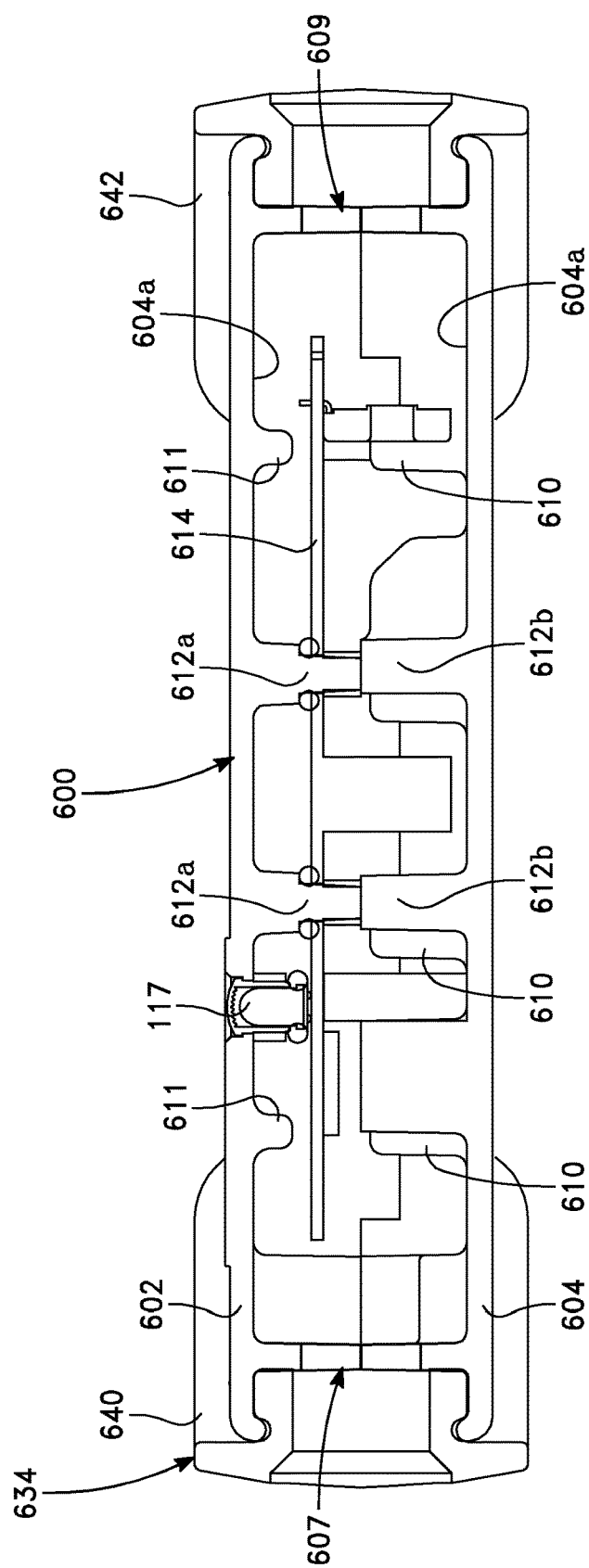
FIG. 16 is a cross-sectional elevational side view corresponding to FIG. 10.

One embodiment of the housing 230 is illustrated in FIGS. 9-16. FIG. 9 is an orthographic view of the EVSE cable 100 including the housing 230, while FIG. 10 is an enlarged view corresponding to FIG. 9. FIG. 11 is an exploded orthographic view corresponding to FIG. 10. FIG. 12 is an enlarged detailed view of a bumper depicted in FIG. 11. FIG. 13 is a cut-away end view corresponding to FIG. 10. FIG. 14 is an elevational side view corresponding to FIG. 10. FIG. 15 includes elevational end views corresponding to FIG. 10 showing the housing 230 at different rotational orientations. FIG. 16 is a cut-away elevational side view of a completed assembly corresponding to FIG. 11.

In the embodiment illustrated in FIGS. 9-16, the housing 230 includes a shell 600 as indicated in FIG. 9. As shown in FIG. 11, the shell 600 is formed as two matching halves, namely a top half shell 602 and a bottom half shell 604, both preferably formed of a hard high-impact material, which may be plastic, metal, alloy, carbon fiber or other synthetic material. The top half shell 602 has a ceiling 602*a* and a side wall 602*b*, while the bottom half shell 604 has a floor 604*a* and a side wall 604*b*. There are exposed edges 602*c*, 604*c* of the side walls 602*b* and 604*b* that are generally congruent with one another. The ceiling 602*a* and floor 604*a* are generally flat while the side walls 602*b* and 604*b* follow a "racetrack shape" defined by long straight edges 602*c*-1, 604*c*-1, respectively, and short curved edges 602*c*-2, 604*c*-2, respectively. The top half shell 602 has half-circle openings 606*a*, 606*b* at respective ends of the side wall 602*b*. Similarly, the bottom half shell 604 has half-circle openings 608*a*, 608*b* at respective ends of the side wall 604*b*. The half circle openings form circular openings 607, 609 (shown in FIG. 16) at the respective ends of the shell 600 when the two half shells 602, 604 are mated. The top and bottom half shells 602, 604 have structurally reinforcing interior ribs 610, 611, respectively, extending in transverse direction to opposite sides. The ribs 610 of the bottom half shell 604 are visible in the view of FIG. 11, and there are corresponding ribs 611 in the top half shell 602 visible in FIG. 16. Interior reinforcing posts 612 extend from the floor 604*a* to the ceiling 602*a* are each divided into separate half posts, of which the bottom half posts 612*b* extending from the floor 604*a* are visible in the view of FIG. 11, while the top half posts 612*a* are shown in FIG. 16 and in hidden line in FIG. 11.

A circuit board 614 supports the electrical and electronic components of the in-line controller 115 previously described herein with reference to FIGS. 2 and 3. The circuit board 614 is held within the interior volume formed between the two half shells 602, 604, as shown in FIG. 11. The circuit board 614 has a pair of holes 616*a*, 616*b* through which the reinforcing posts 612 extend. The components mounted on the circuit board 614 are the components of the in-line controller 115 of FIGS. 1 and 2, and include the light emitting diodes 117 previously referred to herein, and transparent covers 118. LED holes 622 in the ceiling 602*a* are in registration with the LEDs 117 and are sealed by respective O-rings 119. Permanent fasteners 620*a* through 620*d* provide permanent attachment between the top and bottom half shells 602, 604, as is described below in greater detail.

As best seen in the view of FIG. 13, the top half shell 602 has an interior side wall 626 parallel to the side wall 602b and forming an upper groove 628 between the two side walls 602b and 626. In like manner, the bottom half shell 604 has an interior side wall 630 parallel to the side wall 604b and forming a lower groove 632 between the two side walls 604b and 630.

A bumper 634 formed of an elastically deformable material, such as rubber, surrounds the side walls 602b, 604b. As shown in FIGS. 11-13, the bumper 634 consists of an outer case 634a and an interior belt 634b generally parallel with the outer case 634a. The interior belt 634b forms upper and lower lips 634b-1 and 634b-2 that fit within the upper and lower grooves 628, 632, respectively. The outer case 634a and the upper lip 634b-1 form an upper bumper groove 636 between them, while the outer case 634a and the lower lip 634b-2 form a lower bumper groove 638 between them. A lip of the upper side wall 602b is held in the upper bumper groove 636, with some elastic deformation of the upper bumper groove 636, while a lip of the lower side wall 604b is held in the lower bumper groove 638, with some elastic deformation of the lower bumper groove 638.

The outer case 634 has a pair of arcuate end skirts 640, 642 covering the short curved edges 602c-2, 604c-2, respectively, of the side walls 602c, 604c. The outer case 634 further includes gripping saddles 644, 646 covering the long straight edges 602c-1, 604c-1, respectively, of the side walls 602c, 604c. The arcuate end skirts 640, 642 have a major height, H (FIG. 12), extending above the plane of the ceiling 602a and below the plane of the floor 604a, while the gripping saddles 644, 646 have a minor height, h (FIG. 12) that is less than H. As shown in FIGS. 13 and 14, this feature enables air to flow freely around and underneath the shell 600 whenever the unit is resting on a surface, for improved cooling, because the end skirts 640, 642 hold the shell 600 above the surface. A hole 648 in the end skirt 640 is in registration with the hole 607 formed by the half circle openings 606b, 608b in the half shells 602, 604, respectively. A hole 649 in the end skirt 642 is in registration with the hole 609 formed by the half circle openings 606a, 608a in the half shells 602, 604, respectively. The end skirts 640, 642 have arcuate convex crests 640a, 642a. The effect of this feature is illustrated in FIG. 15, in which the in-line controller 115 tends to rotate until it rests on one of its major faces after being placed on its edge. This rotation places the in-line controller 115 in the strongest orientation to resist compression if stepped on or run over by a vehicle.

FIG. 17 illustrates how the permanent fasteners 620a through 620d are tightly received into holes 656 in the upper half shell 602 and holes 658 in the lower half shell 604. FIGS. 18A, 18B and 18C illustrate different embodiments of the permanent fasteners 620 that may be inserted into the holes 656, 658, including an expandable insert (FIG. 18A), a barbed insert (FIG. 18B), and a press-fit insert (FIG. 18C). With the foregoing features, the two half shells 602, 604 are permanently attached by pressing them together, and the fastening cannot be undone.

Figure 19:
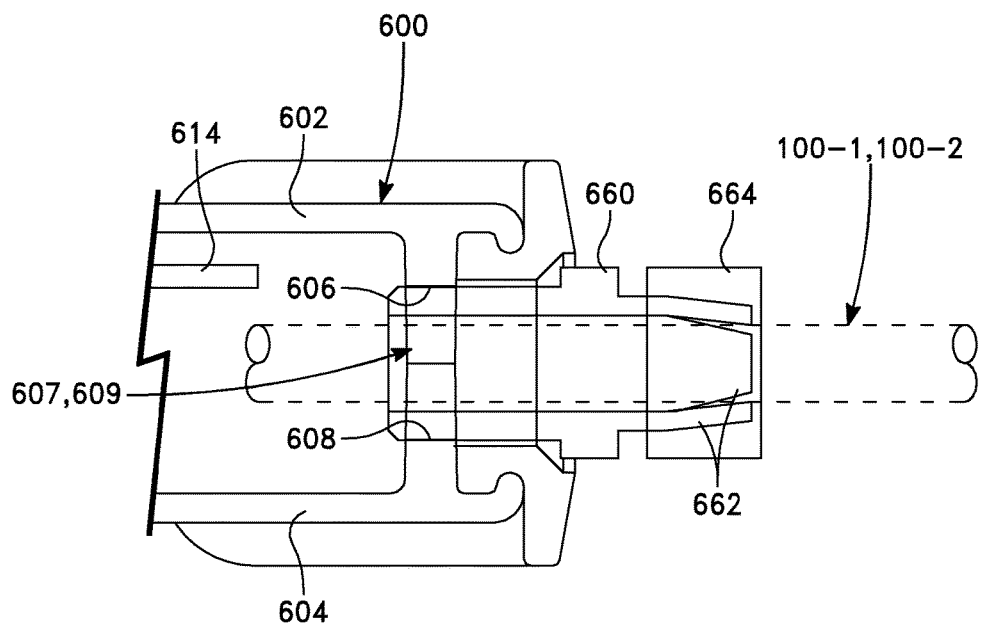
FIG. 19 is a cut-away elevational side view corresponding to FIG. 10 depicting a first embodiment of cable strain relief.

FIG. 19 depicts one type of cable strain relief that may be employed to isolate the electrical connections (between the conductors in each cable 100-1, 100-2 and components on the circuit board 614) from tension on the cables 100-1, 100-2. FIG. 19 is a view of one of the two circular openings 607, 609 at each end of the shell 600 depicting a structure that is common to both. An interior end of a hollow cylinder 660 is threadably engaged inside the circular opening 607. At its exterior end, the hollow cylinder 660 protrudes outwardly from the shell 600 and is divided into plural compressible leaves 662. The cable (100-1 or 100-2) extends through the hollow cylinder 660. A nut 664 is threadably engaged around the exterior end of the hollow cylinder 660 and compresses the plural leaves 662 together against the outside surface of the cable 100-1 or 100-2 as the nut is tightened onto the hollow cylinder. In compressing the outer surface of the cable 100 in this manner provides an integral seal between each cable section 100-1, 100-2 and the housing 230, so that the housing 230 and the cable sections 100-1, 100-2 form an integral cable.

Figure 20:
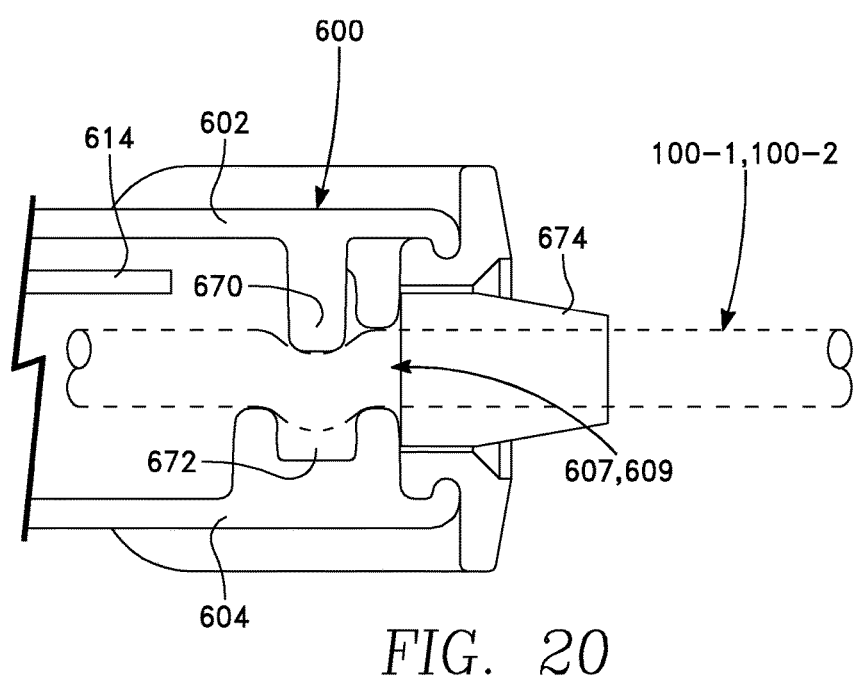
FIG. 20 is a cut-away elevational side view corresponding to FIG. 10 depicting a second embodiment of cable strain relief.

FIG. 20 depicts another cable strain relief feature that may be used alone or in combination with the cable strain relief feature of FIG. 19. FIG. 20 is a view of one of the two circular openings 607, 609, and depicts a structure that is common to both. In FIG. 20, the upper half shell 602 has a downwardly extending post 670 near the circular opening 607, while the lower half shell 604 has an upwardly opening socket 672 in registration with the post 670. The post 670 deflects the cable (100-1 or 100-2) into the socket 672, bending the cable by a predetermined amount that is compatible with the flexibility of the cable. Optionally, a hollow cylinder or bushing 674 may surround the cable and be threaded or bonded into the hole 607 (or 609).

In one alternative embodiment, only the cable (100-1 or 100-2) is inserted through the hole (607 or 609), and the hole is sized so that its edge compresses the outer insulator of the cable, thereby providing cable strain relief.

In another alternative embodiment depicted in FIG. 21, an elastic or plastic hollow fitting 680 fits around the exterior of the cable 100-1 (100-2). The fitting 680 has a circular groove 682 that receives the edges of the two half circular openings 606, 608. The fitting 680 may include a flexible conical section 684 that provides relief from lateral bending of the cable. In a further aspect, the two half circular openings 606, 608 may not be circular, but instead may be non-circular, to enhance compression of the cable 100-1 (in one embodiment) or of the fitting 680 (in another embodiment). One shape of a non-circular opening is depicted in FIG. 22A, at a point in time before the two half shells 602, 604 are brought together. As the two half shells 602, 604 are moved toward one another (FIG. 22B), the fitting 680 begins to deform until it conforms to the non-circular shape of the opening when the two half shells 602, 604 are mated (FIG. 22C). In compressing the outer surface of the cable 100 in this manner provides an integral seal between each cable section 100-1, 100-2 and the housing 230, so that the housing 230 and the cable sections 100-1, 100-2 form an integral cable.

FIGS. 23A, 23B and 23C depict alternative shapes of cable openings 606, 608 providing strain relief, including a hexagonal opening (FIG. 23A), an octagonal opening (FIG. 23B) and a square or diamond-shaped opening (FIG. 23C).

While the foregoing is directed to embodiments of the present invention, other and further embodiments of the invention may be devised without departing from the basic scope thereof, and the scope thereof is determined by the claims that follow.

What is claimed is:

1. A method for an electric vehicle supply equipment (EVSE) system for charging an electric vehicle, the method comprising:
 a) sensing an present temperature; and
 b) controlling a pulse generator coupled to a control pilot conductor by reducing a pulse duty cycle of the pulse generator from a nominal pulse duty cycle by a reduction factor that is a function of an increase of the sensed present temperature above a predetermined threshold temperature.

2. The method of claim 1, wherein the function is a proportional function.

3. The method of claim 1, wherein the reduction factor is a function of the closeness of the sensed present temperature to a maximum operating temperature.

4. The method of claim 1, wherein the predetermined threshold temperature is in a range of 10% to 30% of a maximum operating temperature.

5. The method of claim 1, wherein the electric vehicle responds to a change in pulse duty cycle by changing current draw accordingly.

6. A method for an electric vehicle supply equipment (EVSE) system for charging an electric vehicle, the method comprising:

a) sensing an present temperature; and
b) controlling a pulse generator coupled to a control pilot conductor by reducing a pulse duty cycle of the pulse generator by a reduction factor that is a function of a closeness of the sensed present temperature to a maximum operating temperature, whenever the sensed present temperature exceeds a predetermined threshold temperature.

7. The method of claim 6, wherein the function is a proportional function.

8. The method of claim 6, wherein the predetermined threshold temperature is in a range of 10% to 30% of said maximum operating temperature.

9. The method of claim 6, wherein the electric vehicle responds to a change in pulse duty cycle by changing current draw accordingly.

* * * * *